(12) United States Patent
Uchida et al.

(10) Patent No.: US 10,381,600 B2
(45) Date of Patent: Aug. 13, 2019

(54) ORGANIC ELECTROLUMINESCENCE DEVICE, ILLUMINATION DEVICE, AND DISPLAY DEVICE

(71) Applicant: Sharp Kabushiki Kaisha, Sakai, Osaka (JP)

(72) Inventors: Hideki Uchida, Sakai (JP); Katsuhiro Kikuchi, Sakai (JP); Yoshiyuki Isomura, Sakai (JP); Eiji Koike, Sakai (JP); Satoshi Inoue, Sakai (JP); Yuto Tsukamoto, Sakai (JP); Masanori Ohara, Sakai (JP); Asae Ito, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/758,408

(22) PCT Filed: Aug. 10, 2016

(86) PCT No.: PCT/JP2016/073527
§ 371 (c)(1),
(2) Date: Mar. 8, 2018

(87) PCT Pub. No.: WO2017/043242
PCT Pub. Date: Mar. 16, 2017

(65) Prior Publication Data
US 2018/0269428 A1    Sep. 20, 2018

(30) Foreign Application Priority Data

Sep. 10, 2015    (JP) ................................ 2015-178569

(51) Int. Cl.
*H01L 51/52* (2006.01)
*G02B 5/20* (2006.01)
(Continued)

(52) U.S. Cl.
CPC ............ *H01L 51/5271* (2013.01); *G02B 5/20* (2013.01); *H01L 27/3206* (2013.01);
(Continued)

(58) Field of Classification Search
CPC ........................... H01L 51/5284; H05B 33/24
See application file for complete search history.

(56) References Cited

U.S. PATENT DOCUMENTS

2001/0030511 A1    10/2001    Yamazaki et al.
2004/0206960 A1    10/2004    Nishikawa
(Continued)

FOREIGN PATENT DOCUMENTS

CN        1535096 A        10/2004
CN        102736309 A      10/2012
(Continued)

OTHER PUBLICATIONS

English translation of JP 2011/228229 published Nov. 10, 2011.*
Official Communication issued in International Patent Application No. PCT/JP2016/073527, dated Nov. 8, 2016.

*Primary Examiner* — Grant S Withers
(74) *Attorney, Agent, or Firm* — Keating & Bennett, LLP

(57) ABSTRACT

An organic electroluminescence device includes a base material including a recessed portion on one face side, and a light emitting element. The light emitting layer including a reflective layer disposed at least on a surface of the recessed portion, a filling layer that has optical transparency and is filled and disposed in the recessed portion with the reflective layer interposed between the recessed portion and the filling layer, a first electrode that has optical transparency and is disposed at least on an upper-layer side of the filling layer, an organic layer that includes at least a light emitting layer and is disposed on an upper layer of the first electrode, and a second electrode that has optical transparency and is disposed on an upper-layer side of the organic layer. The
(Continued)

organic electroluminescence device includes a display region divided into a plurality of unit regions separated from each other. The unit regions each has a light emitting area and a non emissive area that are partitioned. The light emitting area includes the light emitting element, and the non emissive area includes a light absorption layer.

20 Claims, 24 Drawing Sheets

(51) Int. Cl.
  *H05B 33/02* (2006.01)
  *H05B 33/10* (2006.01)
  *H05B 33/12* (2006.01)
  *H05B 33/22* (2006.01)
  *H05B 33/24* (2006.01)
  *H01L 27/32* (2006.01)
  *H01L 51/50* (2006.01)
  *H01L 51/56* (2006.01)

(52) U.S. Cl.
  CPC ...... *H01L 51/5088* (2013.01); *H01L 51/5234* (2013.01); *H01L 51/5265* (2013.01); *H01L 51/5284* (2013.01); *H01L 51/56* (2013.01); *H05B 33/02* (2013.01); *H05B 33/10* (2013.01); *H05B 33/12* (2013.01); *H05B 33/22* (2013.01); *H05B 33/24* (2013.01); *H01L 27/322* (2013.01); *H01L 2251/5315* (2013.01); *H01L 2251/558* (2013.01)

(56) References Cited

U.S. PATENT DOCUMENTS

| | | | |
|---|---|---|---|
| 2010/0051949 A1* | 3/2010 | Yamazaki | H01L 29/4908 257/57 |
| 2012/0262637 A1 | 10/2012 | Ikeda et al. | |
| 2014/0191215 A1* | 7/2014 | Tojo | H01L 51/5284 257/40 |
| 2015/0318400 A1 | 11/2015 | Morita et al. | |
| 2016/0308066 A1 | 10/2016 | Ge et al. | |
| 2017/0235314 A1* | 8/2017 | Lin | G05D 1/0246 382/153 |
| 2017/0256748 A1* | 9/2017 | Koike | H01L 51/5036 |
| 2017/0263896 A1* | 9/2017 | Inoue | H05B 33/24 |
| 2017/0280530 A1* | 9/2017 | Matsunaga | H05B 33/10 |
| 2017/0317148 A1* | 11/2017 | Uchida | G09F 9/30 |
| 2017/0317315 A1* | 11/2017 | Yang | H01L 27/322 |
| 2018/0097195 A1* | 4/2018 | Inoue | H05B 33/06 |
| 2018/0226615 A1* | 8/2018 | Uchida | G09F 9/30 |
| 2018/0287099 A1* | 10/2018 | Uchida | G02B 5/20 |

FOREIGN PATENT DOCUMENTS

| | | |
|---|---|---|
| CN | 104900654 A | 9/2015 |
| CN | 104904017 A | 9/2015 |
| JP | 2002-333861 A | 11/2002 |
| JP | 2005-189304 A | 7/2005 |
| JP | 2010-080952 A | 4/2010 |
| JP | 2011-228229 A | 11/2011 |
| JP | 2012-230789 A | 11/2012 |
| JP | 2014-132522 A | 7/2014 |

* cited by examiner

ORGANIC ELECTROLUMINESCENCE DEVICE, ILLUMINATION DEVICE, AND DISPLAY DEVICE

TECHNICAL FIELD

Some aspects of the disclosure relates to an organic electroluminescence device, an illumination device, and a display device.

This application claims priority from JP 2015-178569, filed in Japan on Sep. 10, 2015, the entirety of which is incorporated by reference herein.

BACKGROUND ART

Development of an organic EL display as a candidate of next generation display techniques has progressed. Electroluminescence is shortened to "EL" hereafter. The organic EL display is a self light emitting element and has a simpler structure than a liquid crystal display including a white backlight, a liquid crystal substrate (TFT substrate), and a color filter substrate. For this reason, production of a thin and light flexible display at low cost in future is expected.

An organic EL display device has advantages such as self-luminosity, high display quality, excellent response performance, and possibility of decrease in thickness and weight. Therefore, the organic EL display is often used as a mobile display (e.g., PTL 1).

CITATION LIST

Patent Literature

PTL 1: JP 2002-333861 A

SUMMARY

Technical Problem

However, a pixel electrode in the organic EL display is often formed from a metal layer. Therefore, reflection of external light cannot be suppressed, and viewability under bright light is significantly low. As a countermeasure, a configuration in which a circularly polarizing plate is provided on one face side of a light-emitting portion to prevent reflection is also proposed for the organic EL display. However, the viewability is not sufficiently improved due to scattered light and stray light in an element.

An aspect of the disclosure is made in view of the above-described problems of the related art. An object of the disclosure is to provide an organic electroluminescence device, an illumination device, and a display device in which reflection of external light is reduced to improve the viewability.

Solution to Problem

An organic electroluminescence device according to an aspect of the disclosure includes a base material including a recessed portion on one face side, and a light emitting element, the light emitting layer including a reflective layer, a filling layer having optical transparency, a first electrode having optical transparency, an organic layer including at least a light emitting layer, and a second electrode having optical transparency. The reflective layer is disposed at least on a surface of the recessed portion. The filling layer is filled and disposed at an inside of the recessed portion with the reflective layer interposed between the recessed portion and the filling layer. The first electrode is disposed at least on an upper-layer side of the filling layer. The organic layer is disposed on an upper layer of the first electrode. The second electrode is disposed on an upper-layer side of the organic layer. The organic electroluminescence device includes a display region divided into a plurality of unit regions separated from each other. The plurality of unit regions each includes a light emitting area and a non emissive area that are partitioned. The light emitting element is provided in the light emitting area, and a light absorption layer is provided in the non emissive area.

In an organic electroluminescence device according to one aspect of the disclosure, the light absorption layer may be provided between the base material and the reflective layer in the light emitting area and the non emissive area, and the recessed portion may be provided in the light absorption layer in light emitting area.

In an organic electroluminescence device according to one aspect of the disclosure, a resin layer including the recessed portion and the light absorption layer provided along an upper face of the resin layer including the recessed portion may be provided on the base material.

In an organic electroluminescence device according to one aspect of the disclosure, a color filter substrate including a color filter and the light absorption layer may be provided on the base material. The color filter corresponds to the light emitting area. The light absorption layer partitions the color filter and corresponds to the non emissive area.

In an organic electroluminescence device according to one aspect of the disclosure, the light emitting area and the non emissive area may satisfy a ratio of the light emitting area to the light emitting area and the non emissive area of less than 50%.

In an organic electroluminescence device according to one aspect of the disclosure, a plurality of recessed portions may be provided in the light emitting area, and the reflective layer may be provided in the plurality of recessed portions.

In an organic electroluminescence device according to one aspect of the disclosure, a portion of the reflective layer may be in contact with a portion of the first electrode.

In an organic electroluminescence device according to one aspect of the disclosure, a lower face of the first electrode at a position inside the recessed portion may be positioned lower than a plane including one face side of the base material.

In an organic electroluminescence device according to one aspect of the disclosure, the light emitting area may include a plurality of active elements. The plurality of active elements are configured to independently control light emission.

In an organic electroluminescence device according to one aspect of the disclosure, the plurality of active elements may be formed from an oxide semiconductor.

In an organic electroluminescence device according to one aspect of the disclosure, the plurality of active elements may be formed from an oxide semiconductor.

In an organic electroluminescence device according to one aspect of the disclosure, the plurality of active elements may be electrically connected to the light emitting element through the reflective layer.

In an organic electroluminescence device according to one aspect of the disclosure, an antireflective layer may be provided on the light emitting element.

In an organic electroluminescence device according to one aspect of the disclosure, the color filter may be provided on the light emitting element.

In an organic electroluminescence device according to one aspect of the disclosure, the color filter may be partitioned by the light absorption layer.

An illumination device according to one aspect of the disclosure is produced by forming a recessed portion on one face side of a base material; forming a reflective layer at least along a surface of the recessed portion; forming and disposing a filling layer having optical transparency at an inside of the recessed portion with the reflective layer interposed between the recessed portion and the filling layer; forming a first electrode having optical transparency at least on an upper-layer side of a layer on the filling layer; forming an organic layer on an upper-layer side of the first electrode, the organic layer including at least light emitting layer; and forming a second electrode having optical transparency and light reflectivity on an upper-layer side of the organic layer. The illumination device includes a display region being divided into a plurality of unit regions separated from each other. The plurality of unit regions each includes a light emitting area and a non emissive area that are partitioned. A light emitting element is provided in the light emitting area, and a light absorption layer is provided in the non emissive area.

A display device according to an aspect of the disclosure includes a base material including a recessed portion on once face side, and a light emitting element, the light emitting layer including a reflective layer, a filling layer having optical transparency, a first electrode having optical transparency, an organic layer including at least a light emitting layer, and a second electrode having optical transparency. The reflective layer is disposed at least on a surface of the recessed portion. The filling layer is filled and disposed at an inside of the recessed portion with the reflective layer interposed between the recessed portion and the filling layer. The first electrode is disposed at least on an upper-layer side of the filling layer. The organic layer is disposed on an upper layer of the first electrode. The second electrode is disposed on an upper-layer side of the organic layer. The display device includes a display region being divided into a plurality of unit regions separated from each other. The plurality of unit regions each includes a light emitting area and a non emissive area that are partitioned. The light emitting element is provided in the light emitting area, and a light absorption layer is provided in the non emissive area.

Advantageous Effects of Disclosure

Some aspects of the disclosure can provide an organic electroluminescence device, an illumination device, and a display device in which reflection of external light is reduced to improve the viewability.

DESCRIPTION OF EMBODIMENTS

First Embodiment

A description follows regarding an organic EL device of a first embodiment of the disclosure, with reference to FIGS. 1 to 13B.

The organic EL device of the first embodiment is an example of a top-emitting transparent display using a microcavity structure.

Figure 1:
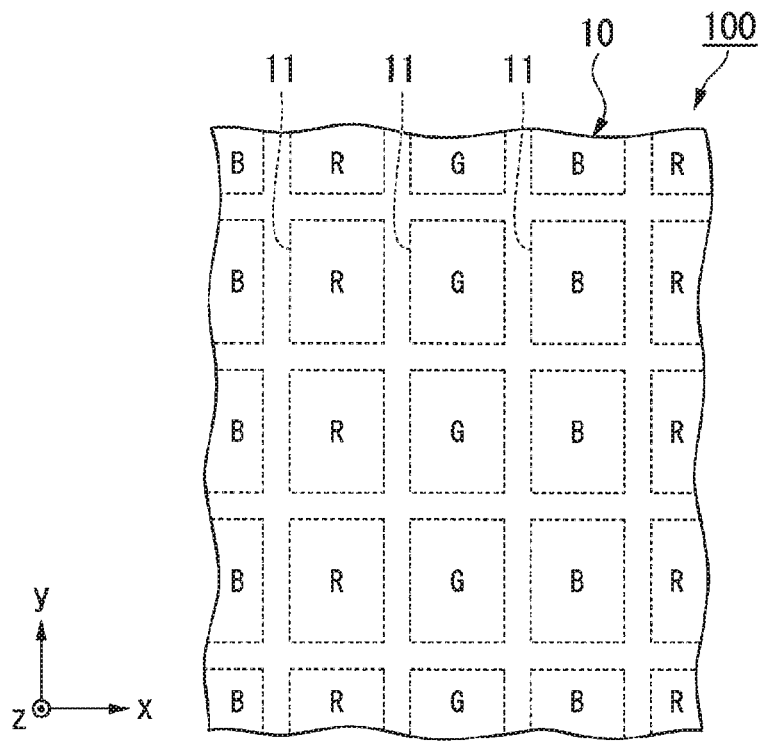
FIG. 1 is a view of a display region of an organic EL device according to a first embodiment.

FIG. 1 is a view of a display region of the organic EL device of the first embodiment.

Note that in each of the drawings below, the dimensional scale is illustrated differently depending on the component, so that each component is easily visible.

As illustrated in FIG. 1, an organic EL device (organic electroluminescence device, illumination device, and display device) 100 of the present embodiment is divided into a plurality of unit regions 11 separated from each other. The organic EL device includes a display region 10, and the display region 10 includes the plurality of unit regions 11 corresponding to RGB. Each of the unit regions 11 is extended along a y-axis in a stripe shape, and is repeatedly disposed along an x-axis in an order of RGB. FIG. 1 is an example in which each of the unit regions 11 of RGB is arranged in a stripe shape. However, the present embodiment is not limited to the example. The arrangement of the unit regions 11 of RGB may be a known RGB pixel arrangement such as a mosaic arrangement and a delta arrangement.

Each of the unit regions 11 of RGB can be used as an illumination device that simultaneously emits red light, green light, and blue light to produce white light. However, applications of the organic EL device 100 are not limited to illumination devices. For example, the organic EL device 100 can be applied to a display device in which each of the unit regions 11 corresponding to red, green, and blue is used as a red sub pixel, a green sub pixel, and a blue sub pixel, respectively, and the three sub pixels form one pixel.

Figure 2:
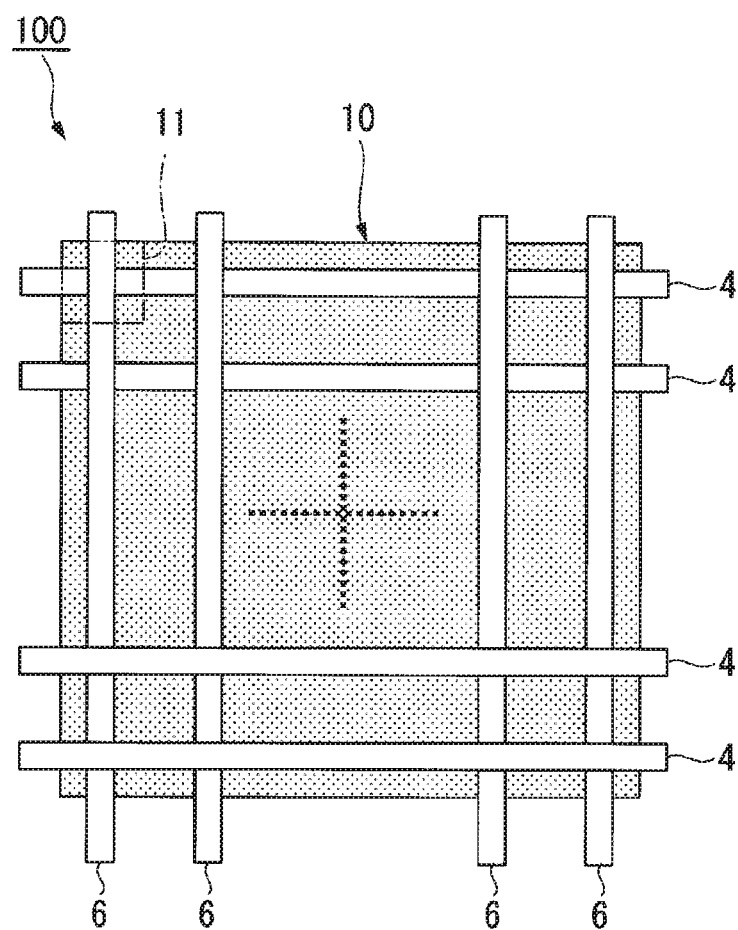
FIG. 2 is a view of detail of the display region of the organic EL device according to the first embodiment.

FIG. 2 is a view of detail of the display region of the organic EL device of the first embodiment.

As illustrating in FIG. 2, a planar shape of the display region 10 in the organic EL device 100 is, for example, a square with sides of 2 mm. The shape of one of the unit regions 11 is, for example, a square with sides of 100 μm. A plurality of first electrodes 4 and a plurality of second electrodes 6 are disposed intersecting each other in the display region 10. Each of the unit regions 11 are positioned at intersections where the plurality of first electrodes 4 and the plurality of second electrodes 6 intersect.

Figure 3A:
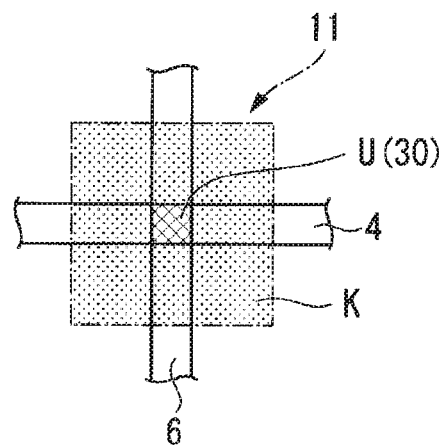
FIG. 3A is an enlarged plan view of one unit region.

FIG. 3A is an enlarged plan view of one of the unit regions.

As illustrated in FIG. 3A, the unit regions 11 each have a light emitting area U and a light absorption area (non emissive area) K. The light emitting area U is a region where external light is not transmitted. The first electrode 4 and the second electrode 6 each have a width of 20 μm. In the unit region 11, an intersection region (20 μm square) between the first electrode 4 and the second electrode 6 corresponds to the light emitting area U. The width of each electrode is not limited to the aforementioned dimension, and can be appropriately changed.

Herein, it is preferable that the light emitting area U and the light absorption area K satisfy a relationship where a ratio of the light emitting area U to the light emitting area U and the light absorption area K is less than 50%. Specifically, it is preferable that the light emitting area U be smaller than the light absorption area K.

Figure 3B:
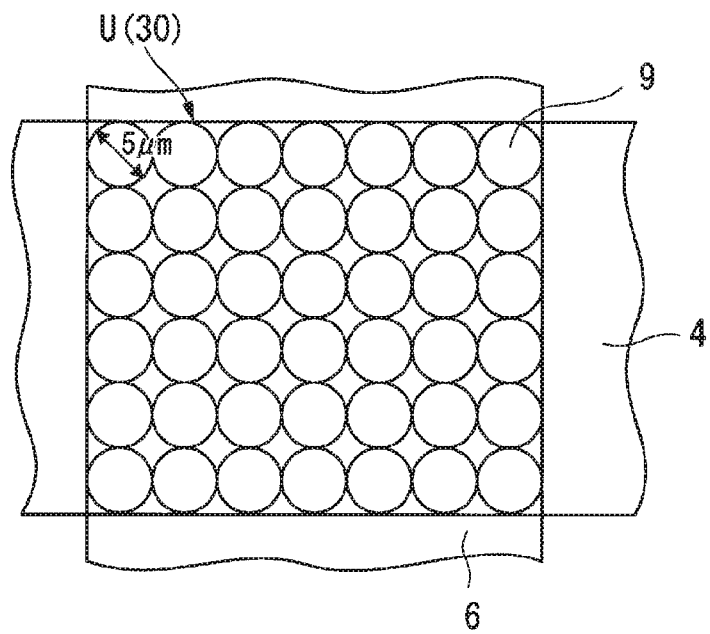
FIG. 3B is an enlarged plan view of a light emitting area in one unit region.

FIG. 3B is an enlarged plan view of the light emitting area in one of the unit regions.

As illustrated in FIG. 3B, an organic EL element (light emitting element) 30 is provided in the light emitting area U of each of the unit regions 11. The organic EL element 30 has a plurality of recessed portions 9 having a circular planar shape. The diameter φ of the recessed portions 9 is, for example, approximately 5 μm. The plurality of recessed portions 9 are regularly disposed in vertical and horizontal directions and form a lattice shape. The density of the recessed portions 9, i.e., a ratio of a total area of the plurality of recessed portions 9 to an area of the light emitting area U, is approximately 70%.

Figure 4:
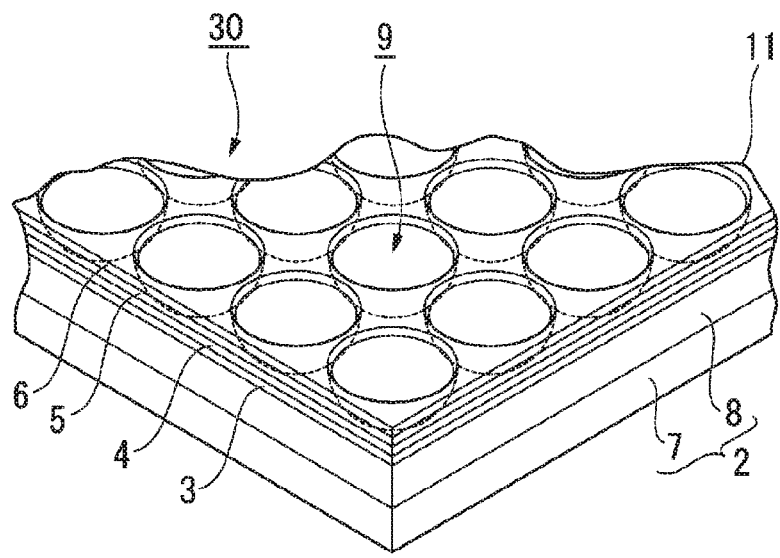
FIG. 4 is a cross-sectional view of the organic EL device sectioned along any plane orthogonal to an upper face of the organic EL device.
Figure 5:
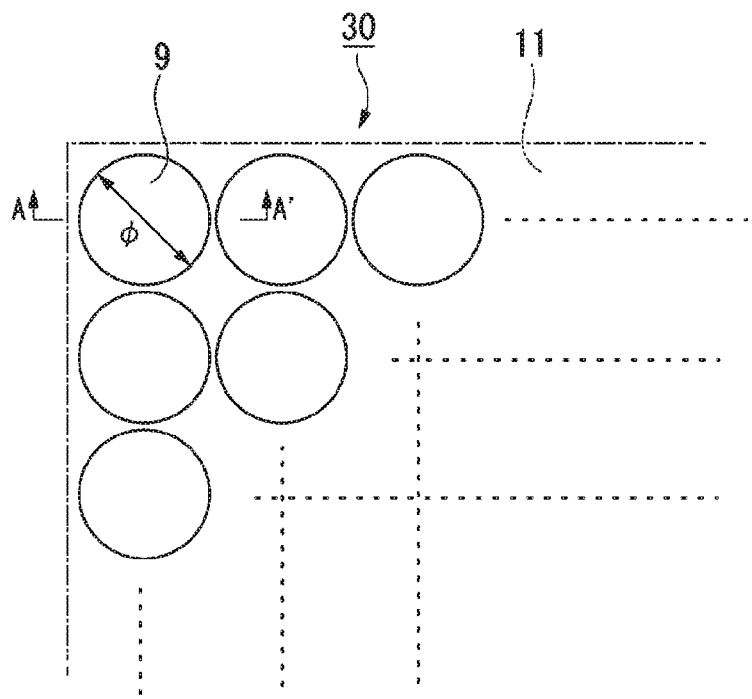
FIG. 5 is an enlarged plan view of a portion of the light emitting area.
Figure 6:
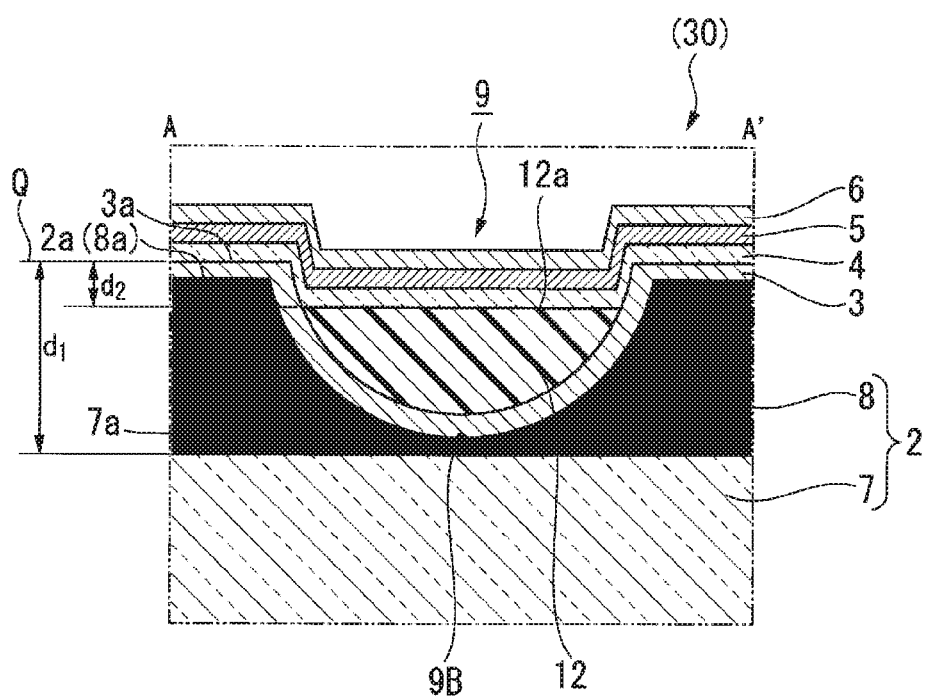
FIG. 6 is a cross-section view taken along line A-A' in FIG. 5.

FIG. 4 is a cross-sectional view of the organic EL device sectioned along any plane orthogonal to an upper face of the organic EL device, and illustrating a light emitting area portion. FIG. 5 is an enlarged plan view of a portion of the light emitting area. FIG. 6 is a cross-sectional view taken along line A-A' in FIG. 5.

As illustrated in FIG. 4, the organic EL device 100 of the present embodiment includes a base material 2, a reflective layer 3, the first electrode 4, an organic layer 5 including a light emitting layer, and the second electrode 6. The organic EL device 100 is a top-emitting display in which light emitted by the light emitting layer is emitted from the second electrode 6 side. The base material 2 includes a substrate 7 and a light absorption layer 8. The light absorption layer 8, the reflective layer 3, the first electrode 4, the organic layer 5, and the second electrode 6 are layered onto one face side of the substrate 7 in this order from the substrate 7 side.

For example, a glass substrate is employed for the substrate 7. Since the organic EL device 100 is a top-emitting organic EL device, the substrate 7 does not need to have optical transparency, and for example, a semiconductor substrate such as a silicon substrate may be employed.

As illustrated in FIG. 5, the plurality of recessed portions 9 are formed in the light emitting area U of the organic EL device 100. As illustrated in FIG. 6, each of the recessed portions 9 is opened upward on an upper face 2a of the base material 2. The cross-sectional shape of the recessed portions 9 is a circular arc. Specifically, an inner face of each of the recessed portions 9 three-dimensionally forms a portion of a spherical surface. The light absorption layer 8 is formed from a photosensitive resin, such as an acrylic, an epoxy, or a polyimide resin that is blacked. Employing a photosensitive resin as a material for the light absorption layer 8 is suitable for a method for forming the recessed portions 9 described later. However, in a case where a method other than the forming method described later is applied, the material constituting the light absorption layer 8 does not need to be photosensitive.

Moreover, the material constituting the light absorption layer 8 may not be a resin, and an inorganic material may be employed.

The reflective layer 3 is provided in each of the unit regions 11. The reflective layer 3 is formed in the light emitting area U in each of the unit regions 11. The reflective layer 3 is formed on an upper face 8a of the light absorption layer 8 including inner faces of the plurality of recessed portions 9. The reflective layer 3 may be formed continuously over the plurality of recessed portions 9 or discontinuously in each of the recessed portions 9. A metal having high reflectance such as aluminum or silver is preferably used as a material constituting the reflective layer 3. In the case of the present embodiment, the reflective layer 3 is formed from, for example, an aluminum film having a film thickness of 100 nm.

A filling layer 12 is filled and disposed at an inside of each of the recessed portions 9 with the reflective layer 3 interposed therebetween. An upper face 12a of the filling layer 12 is positioned lower than a plane Q including an upper face 3a of the reflective layer 3. A height from the upper face 12a of the filling layer 12 to the upper face 3a of the reflective layer 3 is d2. In the case of the present embodiment, the height d2 is set to, for example, 0.1 mm. A height from a lowermost portion 9B of each of the recessed portions 9 to the upper face 3a of the reflective layer 3 is d1. A specific example of the depth d1 is described later.

The upper face 12a of the filling layer 12 is preferably positioned lower than the plane Q including the upper face 3a of the reflective layer 3. However, even when the upper face 12a of the filling layer 12 is at the highest position, the position of the upper face 12a of the filling layer 12 need to be at the same height as the plane Q. In other words, the filling layer 12 is not formed to rise above the plane Q. The filling layer 12 is formed from a resin having optical transparency.

Specifically, an acrylic resin having a transmittance pf 95% is employed as a material for the filling layer 12. The refractive index of the filling layer 12 of the present embodiment is, for example, 1.5.

In the display region 10, the plurality of first electrodes 4 are extended in parallel. In each of the unit regions 11, the first electrode 4 is formed across the upper face 12a of the filling layer 12 and the upper face 3a of the reflective layer 3 in each of the plurality of recessed portions 9 that are present in the light emitting area U. A portion of the first electrode 4 positioned on the upper face 8a of the light absorption layer 8 is in contact with a portion of the reflective layer 3. The lower face of the first electrode 4 at a position inside each of the recessed portions 9 is in contact with the upper face 12a of the filling layer 12. Accordingly, the lower face of the first electrode 4 is positioned lower than the plane Q including the upper face 3a of the reflective layer 3. The first electrode 4 is a transparent electrode formed from a transparent conductive film such as indium tin oxide (ITO) or indium zinc oxide (IZO), and has optical transparency. In the case of the present embodiment, the first electrodes 4 are formed from, for example, ITO having a film thickness of 120 nm. The first electrode 4 functions as an anode for injecting holes into the organic layer 5.

The organic layer 5 is formed in the light emitting area U. The organic layer 5 is layered along the upper face of the first electrode 4 formed across the plurality of recessed portions 9. The organic layer 5 is a layered body formed of an organic material. The organic layer 5 includes a hole injecting layer, a hole transport layer, a light emitting layer, an electron transport layer, and an electron injecting layer. The lower face of the organic layer 5 is positioned lower than the plane Q including the upper face 3a of the reflective layer 3. Detailed description of the configuration and function of each layer configuring the organic layer 5 is given later.

In the display region 10, the plurality of second electrodes 6 are extended in parallel. In each of the unit regions 11, the second electrode 6 is layered along the upper face of the organic layer 5 in the plurality of recessed portions 9 that are present in the light emitting area U. The second electrode 6 is a transparent electrode formed from a transparent conductive film such as indium tin oxide (ITO) or indium zinc oxide (IZO), and has optical transparency. In the case of the present embodiment, the second electrode 6 is formed from, for example, ITO having a film thickness of 120 nm. The second electrode 6 functions as a cathode for injecting electrons into the organic layer 5.

In the present embodiment, a region between the first electrode 4 and the second electrode 6 in the light emitting area U forms a microcavity structure. Light emitted from the light emitting layer is multiply reflected between the first electrode 4 and the second electrode 6. At that time, a component with a specific wavelength of the light emitted from the light emitting layer is enhanced. Moreover, although omitted from the illustration in FIG. 6, an optical adjustment layer referred to as a cap layer is layered on the upper face of the second electrode 6.

Figure 7:
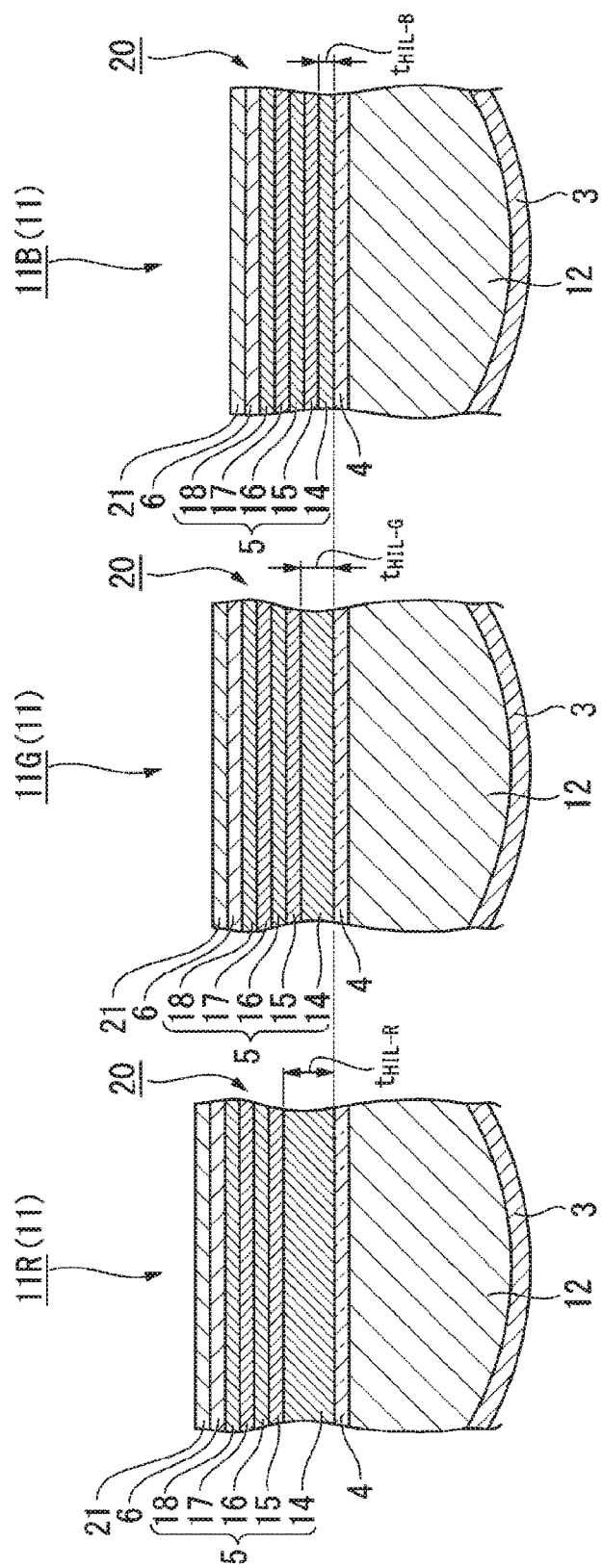
FIG. 7 is a cross-sectional view of detail of a recessed portion structure.

FIG. 7 is cross-sectional view of detail of a recessed portion structure. Herein, an enlarged view of one of a plurality of recessed portion structures configuring the organic EL element 30 is illustrated. The recessed portion structures of the organic EL element 30 in three unit regions 11R, 11G, and 11B have a common basic configuration except that the film thickness of the hole injecting layer is different.

As illustrated in FIG. 7, the organic layer 5 is provided on an upper layer of the first electrode 4 in the recessed portion structures. The organic layer 5 includes a layered film including a hole injecting layer 14, a hole transport layer 15, a light emitting layer 16, an electron transport layer 17, and an electron injecting layer 18 layered from the first electrode 4 side. However, layers other than the light emitting layer 16 may be appropriately introduced as necessary. A single layer may serve as both a transport layer and an injecting layer. In the present embodiment, as described above, an example is given of an organic layer having a 5-layer structure of the hole injecting layer 14, the hole transport layer 15, the light emitting layer 16, the electron transport layer 17, and the electron injecting layer 18. Moreover, as necessary, a layer for preventing migration of charge to the opposite side electrode, such as a hole blocking layer or an electron blocking layer, may be appropriately added.

The hole injecting layer 14 is a layer that functions to increase hole injection efficiency from the first electrode 4 to the light emitting layer 16. Examples that may be employed as the material for the hole injecting layer 14 include benzine, styrylamine, triphenylamine, porphyrin, triazole, imidazole, oxadiazole, polyarylalkane, phenylene diamine, arylamine, oxazole, anthracene, fluorenone, hydrazone, stilbene, triphenylene, azatriphenylene, and derivatives thereof; and heterocyclic conjugated monomers, oligomers, polymers, and the like of an polysilane-based compound, a vinylcarbazole-based compound, a thiophene-based compound, and an aniline-based compound. Molybdenum oxide is blended with these organic materials. The blending ratio of the organic material and the molybdenum oxide is, for example, approximately 80% organic material, and approximately 20% molybdenum oxide.

The hole transport layer 15 is a layer that functions to increase the hole transport efficiency from the first electrode 4 to the light emitting layer 16. An organic material similar to the hole injecting layer 14 may be employed in the hole transport layer 15. Note that the hole injecting layer 14 and the hole transport layer 15 may be a single body, or may be formed as individual layers.

The light emitting layer 16 functions to emit light when energy is released by holes injected from the first electrode 4 side recombining with electrons injected from the second electrode 6 side. The material for the light emitting layer 16 includes, for example, a host material and a dopant material. The material for the light emitting layer 16 may also include an assist material. The host material is included at the highest ratio among the materials constituting the light emitting layer 16. For example, the blending ratio of the host material and the dopant material is approximately 90% host material and approximately 10% dopant material. The host material is easily film formed into the light emitting layer 16 and functions to maintain the film state of the light emitting layer 16. Accordingly, it is desirable that the host material is a stable compound that does not easily crystallize after film formation and does not easily undergo chemical change. Moreover, when an electric field is applied between the first electrode 4 and the second electrode 6, the host material functions such that recombination of carriers occurs within the host molecules, and excitation energy is transferred to the dopant material, causing the dopant material to emit light. The thickness of the light emitting layer 16 is, for example, approximately 60 nm.

Specific examples of the material of the light emitting layer 16 include materials having a high light-emission efficiency, such as a low-molecular fluorescent colorant, a fluorescent macromolecule, and a metal complex. Examples of the material of the light emitting layer 16 include anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene, and derivatives thereof; tris(8-quinolinato)aluminum complex; bis(benzoquinolinato)beryllium complex; tri(dibenzoylmethyl)phenanthroline europium complex; and ditoluylvinylbiphenyl.

The electron transport layer 17 functions to increase the electron transport efficiency from the second electrode 6 to the light emitting layer 16. As the material of the electron transport layer 17, for example, quinoline, perylene, phenanthroline, bisstyryl, pyrazine, triazole, oxazole, oxadiazole, fluorenone, or a derivative and a metal complex thereof can be employed. Specifically, tris(8-hydroxyquinoline)aluminum, anthracene, naphthalene, phenanthrene, pyrene, perylene, butadiene, coumarin, acridine, stilbene, 1,10-phenanthroline, and a derivative, or a metal complex thereof can be employed. The thickness of the electron transport layer 17 is, for example, approximately 15 nm.

The electron injecting layer 18 functions to increase the electron injection efficiency from the second electrode 6 to the light emitting layer 16. As the material of the electron injecting layer 18, for example, compounds such as calcium metal (Ca) or lithium fluoride (LiF) can be employed. Note that the electron transport layer 17 and the electron injecting layer 18 may be a single body, or may be formed as individual layers. The thickness of the electron injecting layer 18 is, for example, approximately 0.5 nm.

A microcavity structure 20 has an effect of enhancing light with a specific wavelength by using resonance of light generated between the first electrode 4 and the second electrode 6. In the case of the present embodiment, the wavelengths of lights emitted from the red, green, and blue unit regions 11R, 11G, and 11B are different. Therefore, an optical path length between the first electrode 4 and the second electrode 6 corresponds to the peak wavelength of light emission spectrum of each color. The optical path lengths are each set so that the optical path length of the red unit region 11R is longest, the optical path length of the blue unit region 11B is shortest, and the optical path length of the green unit region 11G is middle of the two.

There are various procedures of varying the optical path length of the microcavity structure 20 of each of the unit regions 11R, 11G, and 11B. From the viewpoint of reducing influence on resistance value as much as possible, a procedure of varying the thickness of the hole injecting layer 14 is employed. When the thickness of the hole injecting layer 14 of the red unit region 11R is tHIL-R, the thickness of the hole injecting layer 14 of the green unit region 11G is tHIL-G, and the thickness of the hole injecting layer 14 of the blue unit region 11B is tHIL-B, for example, tHIL-R, tHIL-G, and tHIL-B are set so that tHIL-R>tHIL-G>tHIL-B.

Due to the microcavity structure 20, light emitted from the organic layer 5 is repeatedly reflected between the first electrode 4 and the second electrode 6 within a predetermined optical path length range, light with a specific wavelength corresponding to the optical path length is resonated and enhanced, and light with a wavelength that does not correspond to the optical path length is weakened. Accordingly, the spectrum of light extracted to the outside is made steep, the spectral intensity thereof is increased, and the brightness and color purity are improved.

Concerning materials constituting the light emitting layer 16, a light emitting material that emits red light may be used in the red unit region 11R, a light emitting material that emits green light may be used in the green unit region 11G, and a light emitting material that emits blue light may be used in the blue unit region 11B. In the case of the present embodiment, a bipolar material is used for the host material in all the unit regions.

For the dopant material, a phosphorescent material is used in the red unit region 11R and the green unit region 11G, and a fluorescent material is used in the blue unit region 11B. The thickness of the light emitting layer 16 in the red unit region 11R and the green unit region 11G is, for example, approximately 60 nm. The thickness of the light emitting layer 16 in the blue unit region 11B is, for example, approximately 35 nm.

Alternatively, one light emitting material that emits white light may be used in the light emitting area U of all the red unit region 11R, the green unit region 11G, and the blue unit region 11B. Even in this case, lights with different wavelengths of the unit regions 11R, 11G, and 11B are resonated and amplified. As a result, red light is emitted from the red unit region 11R, green light is emitted from the green unit region 11G, and blue light is emitted from the blue unit region 11B.

A cap layer 21 is layered onto the upper face of the second electrode 6. The cap layer 21 functions as a protection layer for protecting the second electrode 6 and as an optical adjustment layer. Note that a color filter may be added on an upper-layer side of the second electrode 6. When the color filter transmits light emitted from the organic layer 5, the color purity can be enhanced.

The configuration of the light absorption layer is not limited to the configuration described above. In the present embodiment, the light absorption layer 8 formed from a blacked resin is formed on the substrate 7, and the plurality of recessed portions 9 are formed in the light absorption layer 8. However, the configuration can be appropriately changed. In a case where patterning through photolithography is difficult in forming the recessed portions 9 in the light absorption layer 8, for example, the following structure can be considered.

Modification of Light Absorption Layer

Figure 8:
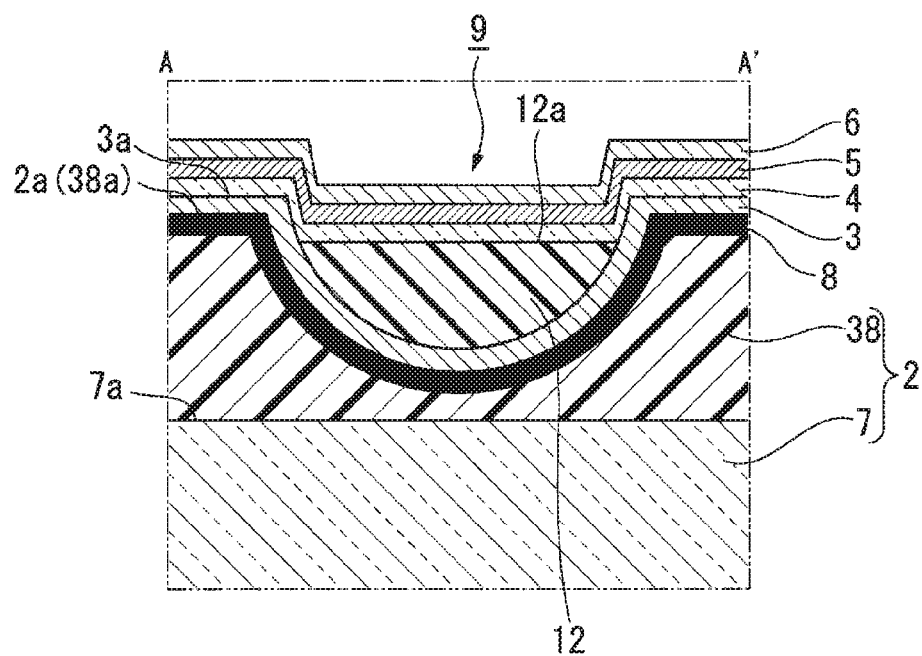
FIG. 8 is a cross-sectional view of a modification of a light absorption layer.

FIG. 8 is a cross-sectional view of a modification of the light absorption layer.

As illustrated in FIG. 8, a transparent resin layer 38 may be formed on the substrate 7, and the light absorption layer 8 may be then formed along an upper face 38a including the plurality of recessed portions 9 formed in the resin layer 38. As described above, the recessed portions 9 are formed in the transparent resin layer 38 in advance, and the light absorption layer 8 is then formed. Thus, the recessed portions 9 can be favorably patterned.

A specific configuration example of the organic EL device 100 is given in Table 1.

Next, three methods can be given as examples of methods for forming the filling layer 12.

A description follows regarding these methods for forming the filling layer 12.

Figure 10A:
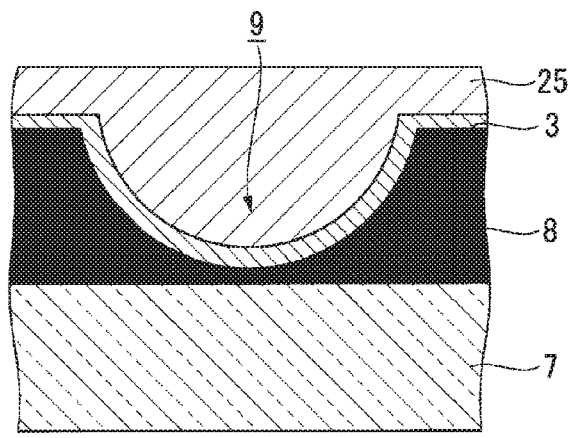
FIG. 10A is a view of a first step for describing a first method for forming a filling layer in an organic EL device.

A first method for forming the filling layer is as follows. First, as illustrated in FIG. 10A, a resin film 25 formed from acrylic, epoxy, or polyimide is formed on the entire surface of the reflective layer 3. The method for forming the resin film 25 is, for example, applying a liquid resin material to the reflective layer 3 using a method such as spin-coating or bar coating. At this time, the film thickness of the resin film 25 is set so that the resin film 25 fills the recessed portions 9, and also covers planar portions of the reflective layer 3.

Figure 10B:
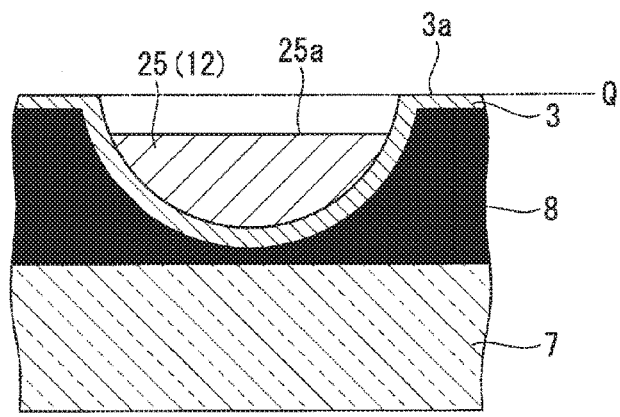
FIG. 10B is a view of a second step for describing the first method for forming a filling layer in an organic EL device.

Next, as illustrated in FIG. 10B, the entire surface of the resin film 25 is etched back using, for example, a method such as plasma ashing (dry ashing). At this time, the etch-back amount is adjusted so that an upper face 25a of the resin film 25 is positioned lower than the plane Q including the upper face 3a of the reflective layer 3. The filling layer 12 is thereby formed.

TABLE 1

|  | Red | Green | Blue |
| --- | --- | --- | --- |
| First electrode ITO: 120 nm | ITO: 120 nm | ITO: 120 nm | ITO: 120 nm |
| HIL | 130 nm | 70 nm | 35 nm |
| Organic HTL material (80%):MoOx (20%) |  |  |  |
| HTL Organic HTL material | 10 | 10 | 10 |
| EML | H(90%):d(10%) 60 nm | H(90%):d(10%) 60 nm | H(90%):d(10%) 35 nm |
|  | H: bipolar material | H: bipolar material | H: bipolar material |
|  | d: phosphorescent material | d: phosphorescent material | d: fluorescent material |
| ETL organic ELT material + doping | 150 nm | 150 nm | 150 nm |
| Second electrode (ITO) | 70 nm | 70 nm | 70 nm |

EML H (host material),
A (assist material),
d (dopant material)

Descriptions follows regarding a process for producing the organic EL device 100 having the above configuration, with reference to FIGS. 9A to 12B. FIGS. 9A to 12B illustrate one recessed portion structure.

Figure 9A:
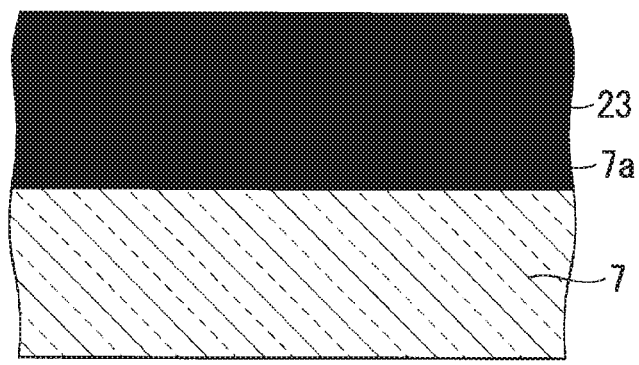
FIG. 9A is a view of a first step for describing a method for manufacturing an organic EL device.

First, as illustrated in FIG. 9A, a positive-type photosensitive resin material is applied to an upper face 7a of the substrate 7 to form a resin layer 23.

Figure 9B:
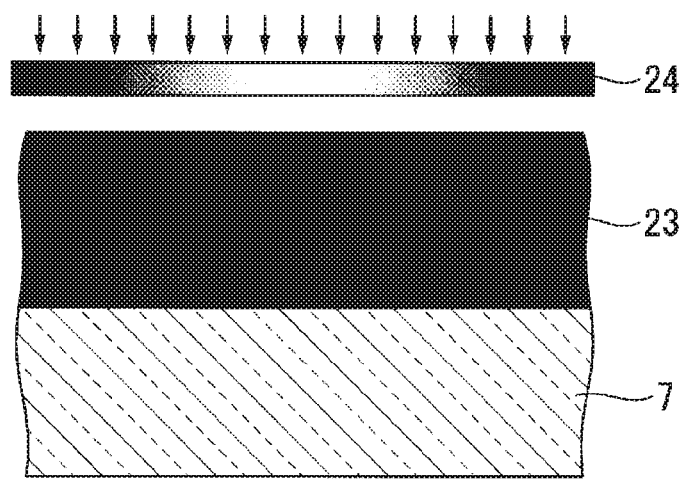
FIG. 9B is a view of a second step for describing the method for manufacturing an organic EL device.

Next, as illustrated in FIG. 9B, the resin layer 23 is exposed through a photomask 24.

At this time, the photomask 24 employed has a predetermined optical transparency distribution, like in a gray-tone mask. More specifically, the photomask 24 has high optical transparency near the center of a circular pattern, and the optical transparency decreases on progression toward peripheral portions. Thus, in the resin layer 23, the degree of exposure is high near the center of the circular pattern, and the degree of exposure decreases on progression toward the peripheral portions.

Figure 9C:
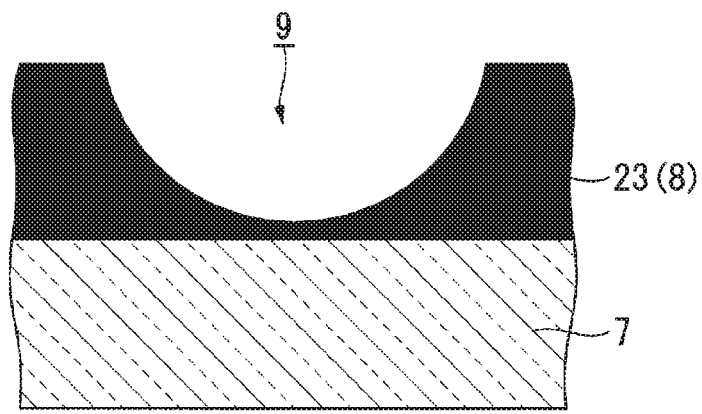
FIG. 9C is a view of a third step for describing the method for manufacturing an organic EL device.

Next, as illustrated in FIG. 9C, the resin layer 23 is developed using a predetermined developer. In accordance with the differences in the degree of exposure of the resin layer 23, the amount of film reduction of the resin layer 23 at this time is high near the center of a circular pattern, and decreases on progression toward the peripheral portions. A recessed portion 9 having a cross-sectional shape of a circular arc is accordingly formed in the resin layer 23, and the light absorption layer 8 is formed.

Figure 9D:
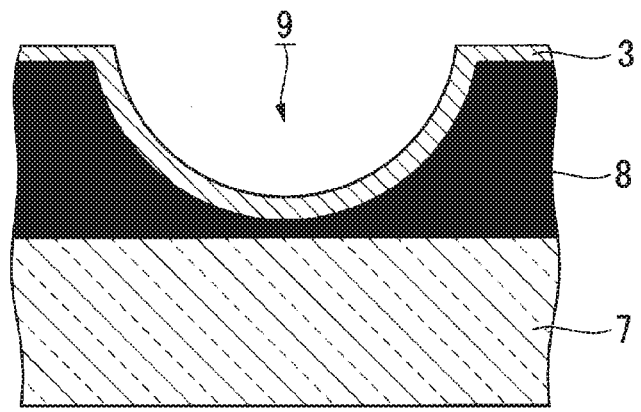
FIG. 9D is a view of a fourth step for describing the method for manufacturing an organic EL device.

Next, as illustrated in FIG. 9D, a metal such as aluminum is deposited on the entire surface of the light absorption layer 8, to form the reflective layer 3.

Figure 10C:
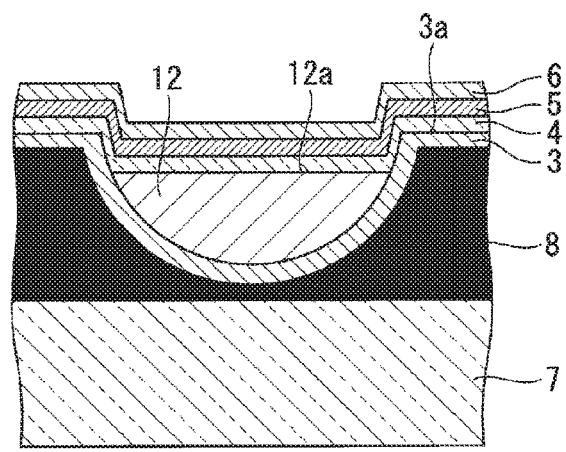
FIG. 10C is a view of a third step for describing the first method for forming a filling layer in an organic EL device.

Next, as illustrated in FIG. 10C, the first electrode 4, the organic layer 5, and the second electrode 6 are sequentially formed on the upper face 3a of the reflective layer 3 and the upper face 12a of the filling layer 12. The first electrode 4, the organic layer 5, and the second electrode 6 are formed by a known process. For example, a pattern may be formed by vacuum deposition using a shadow mask, but the method is not limitation thereto; and a spray method, an inkjet method, a printing method, or a laser transfer method may be employed.

A second method for forming the filling layer is as follows.

Figure 11A:
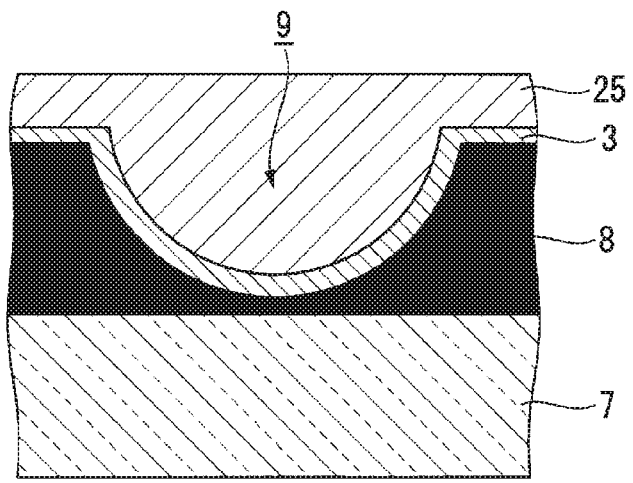
FIG. 11A is a view of a first step for describing a second method for forming a filling layer in an organic EL device.

As illustrated in FIG. 11A, the resin film 25 formed from acrylic, epoxy, or polyimide is formed on the entire surface of the reflective layer 3. This process is the same as that of the first method for forming the filling layer illustrated in FIG. 10A.

Figure 11B:
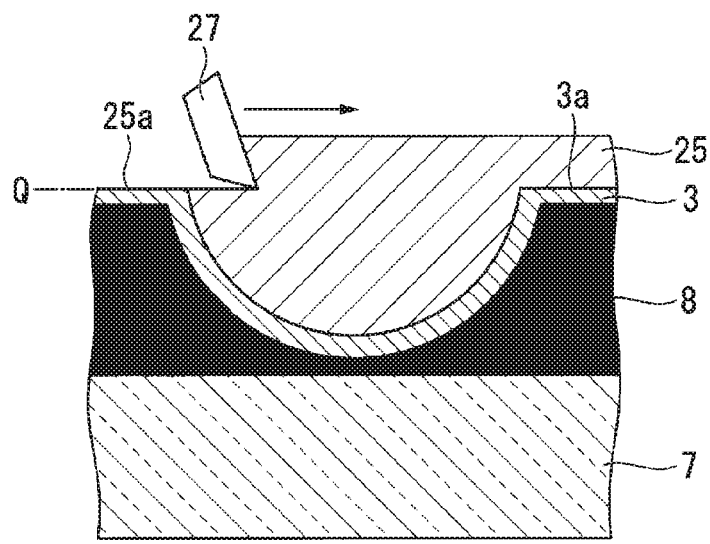
FIG. 11B is a view of a second step for describing the second method for forming a filling layer in an organic EL device.

Next, as illustrated in FIG. 11B, the entire surface of the resin film 25 is leveled using a squeegee 27. At this time, the squeegee 27 is moved along the upper face 3a of the reflective layer 3 so that after the squeegee 27 has passed, the upper face 25a of the resin film 25 is in the same plane as the plane Q including the upper face 3a of the reflective layer 3.

Figure 11C:
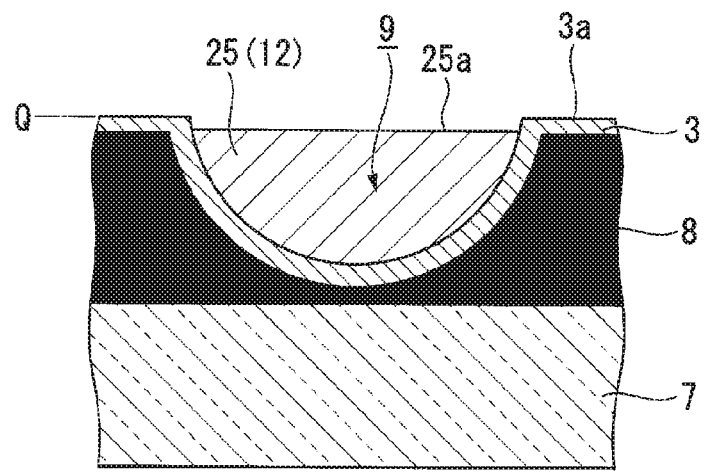
FIG. 11C is a view of a third step for describing the second method for forming a filling layer in an organic EL device.

Next, as illustrated in FIG. 11C, the base material is baked with the resin film 25 remaining in the recessed portions 9.

The volume of the resin film 25 shrinks due to baking, and as a result, the upper face 25a of the resin film 25 is positioned lower than the plane Q including the upper face 3a of the reflective layer 3. The filling layer 12 is thereby formed.

The filling layer 12 can be formed by a method other than the forming methods described above, that includes exposing of the resin film 25 using a photomask, then developing, water-washing, and drying the resin film 25. The photomask has a pattern in which a region corresponding to the recessed portions 9 is shaded. Therefore, during exposure, the acrylic resin layer within the recessed portions 9 is highly exposed by collection of light in the recessed portions 9. This can prevent excess development of the filling layer. As the photomask, for example, a halftone mask may be used.

Figure 11D:
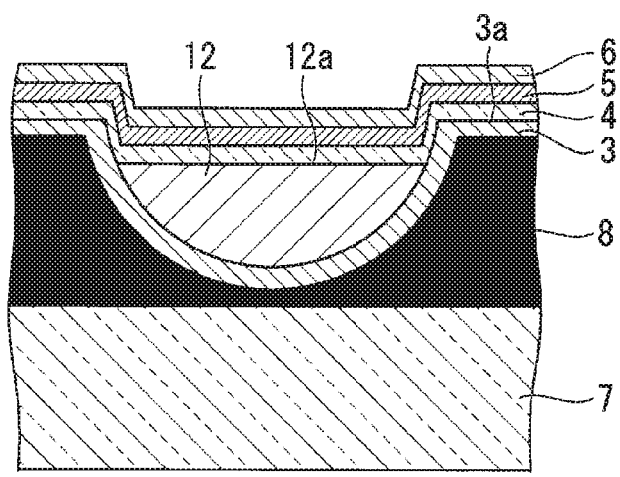
FIG. 11D is a view of a fourth step for describing the second method for forming a filling layer in an organic EL device.

Next, as illustrated in FIG. 11D, the first electrode 4, the organic layer 5, and the second electrode 6 are sequentially formed on the upper face 3a of the reflective layer 3 and the upper face 12a of the filling layer 12. This process is the same as that of the first method for forming the filling layer illustrated in FIG. 10C.

A third method for forming the filling layer is as follows.

Figure 12A:
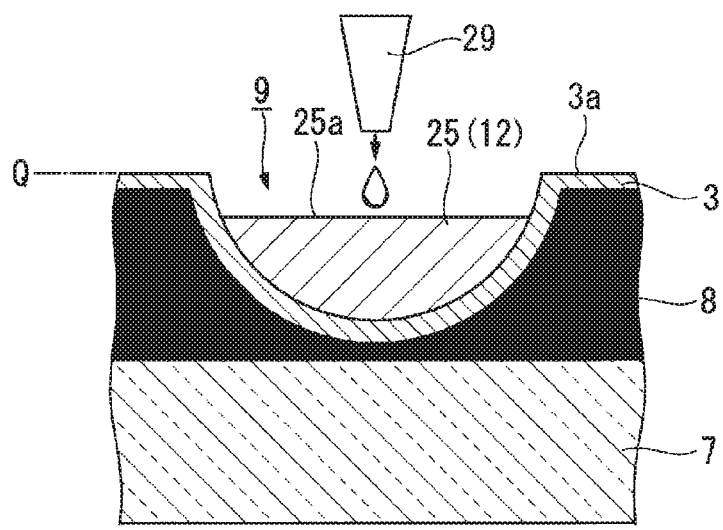
FIG. 12A is a view of a first step for describing a third method for forming a filling layer in an organic EL device.

As illustrated in FIG. 12A, the resin film 25 formed from acrylic, epoxy, or polyimide is layered onto the surface of the reflective layer 3 at the inside of the recessed portions 9. As the method for forming the resin film 25, for example, a resin material is applied to the reflective layer 3 in a liquid drop state using a method such as ink jetting. At this time, the amount of resin material ejected from an inkjet head 29 is adjusted so that the upper face 25a of the resin film 25 is positioned lower than the plane Q including the upper face 3a of the reflective layer 3. The filling layer 12 is thereby formed.

Figure 12B:
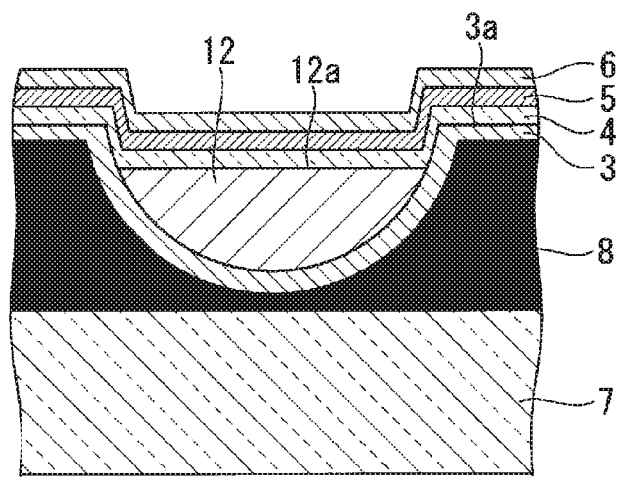
FIG. 12B is a view of a second step for describing the third method for forming a filling layer in an organic EL device.

Next, as illustrated in FIG. 12B, the first electrode 4, the organic layer 5, and the second electrode 6 are sequentially formed on the upper face 3a of the reflective layer 3 and the upper face 12a of the filling layer 12. This process is the same as that of the first method for forming the filling layer illustrated in FIG. 10C.

The organic EL device 100 of the present embodiment is thus completed by the process described above.

Figure 13A:
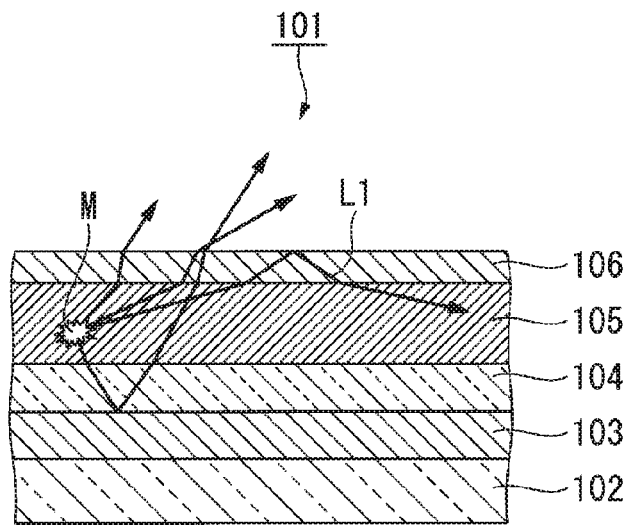
FIG. 13A is a cross-sectional view of a organic EL device in the related art.
Figure 13B:
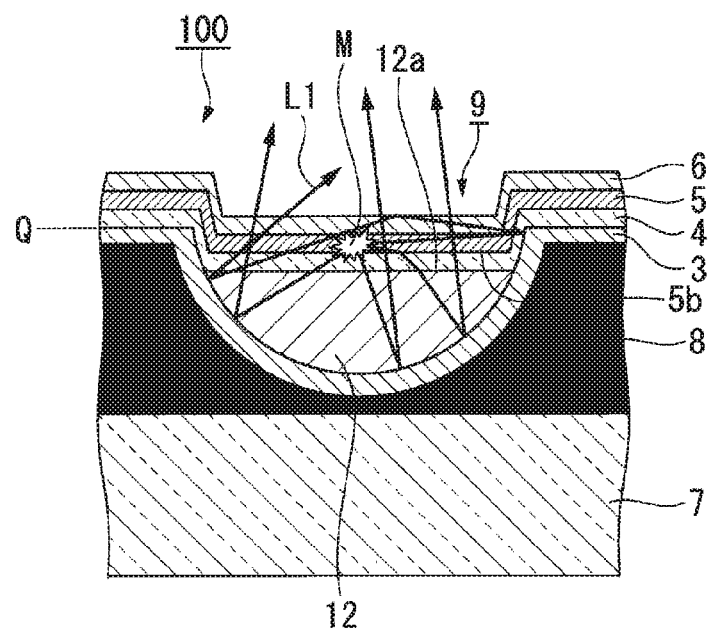
FIG. 13B is a cross-sectional view of the organic EL device according to the first embodiment.

FIG. 13A is a cross-sectional view of an organic EL device 101 in the related art. FIG. 13B is a cross-sectional view of the organic EL device of the first embodiment.

The organic EL device 101 has a configuration in which a reflective layer 103, a first electrode 104, an organic layer 105, and a second electrode 106 are sequentially layered onto a substrate 102. In the organic EL device 101, light emitted from the light emitting layer in the organic layer 105 is emitted uniformly in all directions, and advances through the interior while being refracted by interfaces between respective layers having different refractive indexes. Light that has advanced toward the substrate 102 side is reflected by the reflective layer 103.

Since there is a difference in refractive index at the interface between the second electrode 106 and the external space (air), light incident on this interface at a small angle of incidence is emitted to the external space, and light incident at a large angle of incidence is reflected by this interface and advances though the interior again. For example, light L1 emitted from any light-emission point M in the organic layer 105 in a direction close to a horizontal direction is not easily emitted to the external space even when the angle is somewhat changed by refraction by an inter-layer interface.

Loss due to reflection of light at the interface between the second electrode 106 and the external space (air) does not occur on the path of light advancing through the interior of the organic EL device 101. In contrast thereto, since the reflectivity of metals constituting the reflective layer 103 is generally not 100%, loss due to reflection of light occurs at the interface between the first electrode 104 and the reflective layer 103. Moreover, some of the light is absorbed into respective films while advancing through the interior of the organic EL device 101. Accordingly, the light is attenuated while advancing through the interior of the organic EL device 101. Ordinarily, the refractive index of the organic layer 105 is approximately 1.8. In this case, of the light emitted from the light emitting layer, the proportion of light extracted to the external space is approximately 20%. Thus, the organic EL device 101 in the related art has a problem of low light utilization efficiency.

In contrast thereto, in the organic EL device 100 of the present embodiment, the advance direction of light reflected by the reflective layer 3 changes because the reflective layer 3 is curved along the recessed portions 9, and the light advances through the interior of the organic EL device 100 as illustrated in FIG. 13B. At this time, due to reflection by the reflective layer 3, light originally having a large angle of incidence at the interface between the second electrode 6 and the external space (air) is converted to have a smaller angle of incidence than a critical angle at the interface between the second electrode 6 and the external space, and is then extracted to the external space.

Particularly, in the case of the present embodiment, as described above, the upper face 12a of the filling layer 12 is positioned lower than the plane Q including the upper face 3a of the reflective layer 3, and a lower face 5b of the organic layer 5 is also positioned lower than the plane Q. That is, the reflective layer 3 is present at a side (horizontal direction in FIG. 13B) of the organic layer 5 positioned inside each of the recess portions 9. Accordingly, for example, the light L1 emitted from any light-emission point M in the organic layer 5 in a direction close to a horizontal direction is reflected by the reflective layer 3 and the angle of the advance direction is changed. Unlike the organic EL device 101 in the related art illustrated in FIG. 13A, even the light L1 emitted from the light-emission point M in the direction close to a horizontal direction is reflected by the reflective layer 3, and then incident on the interface between the second electrode 6 and the external space at a smaller angle of incidence than the critical angle, at that time, light can be extracted to the external space. Thus, an organic EL device 100 having excellent light utilization efficiency can be provided.

Note that in the present embodiment, light emitted in the substantially horizontal direction from the light-emission point M in the organic layer 5 can also incident on the reflective layer 3 because the upper face 12a of the filling layer 12 is positioned lower than the plane Q and the lower face 5b of the organic layer 5 is also positioned lower than the plane Q. However, in a case where the upper face 12a of the filling layer 12 are on a same plane with the plane Q, the lower face 5b of the organic layer 5 is be positioned higher than the plane Q. In this case, light emitted in the substantially horizontal direction from the light-emission point M in the organic layer 5 does not incident on the reflective layer 3 because the reflective layer 3 is present at the side of the organic layer 5 positioned inside each of the recessed portions 9. However, the proportion of light that is emitted from the light-emission point M in the organic layer 5 within a predetermined angle range close to the horizontal direction and incidents on the reflective layer 3 is sufficiently increased as compared to the organic EL device 101 in the related art. Accordingly, even in this configuration, an organic EL device having excellent light utilization efficiency can be provided.

Figure 14A:
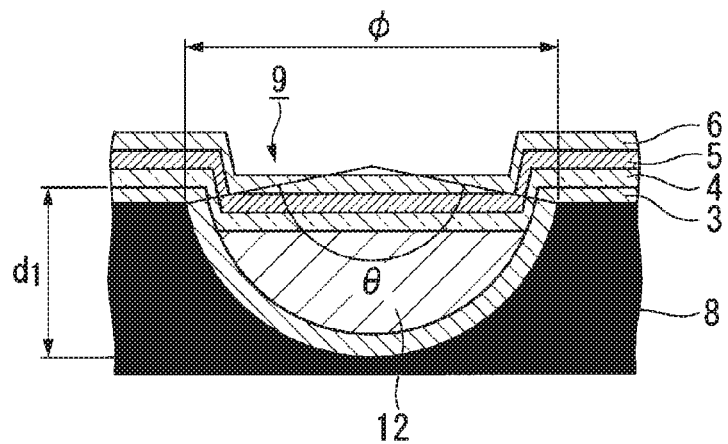
FIG. 14A is a first view for describing a parameter showing a depth of a recessed portion.
Figure 14B:
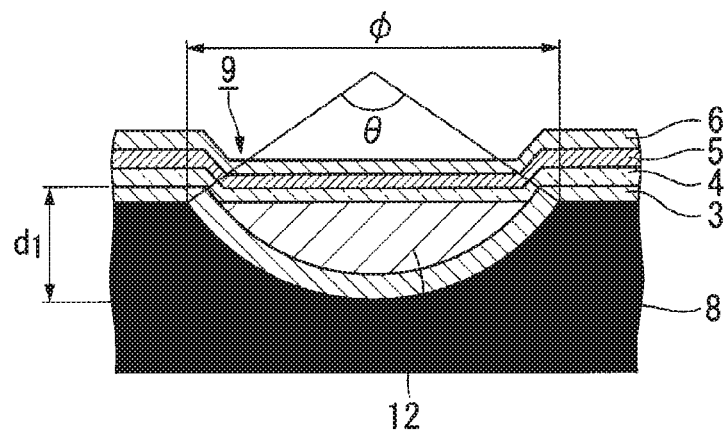
FIG. 14B is a second view illustrating the parameter showing a depth of a recessed portion.

FIGS. 14A and 14B are views for describing a parameter of depth of each of the recessed portions.

In the present embodiment, as a parameter of depth of the recessed portions 9, a central angle of a circular arc that is the cross-sectional shape of the recessed portions 9 is used.

As illustrated in FIGS. 14A and 14B, the diameter φ of a circle of the recessed portions 9 as viewed in plan view is made constant, and the cross-sectional shape of the recessed portions 9 is defined as a circular arc. Therefore, the depth d1 of the recessed portions 9 indicates the central angle θ of the circular arc. Accordingly, the deeper the depth d1 of the recessed portions 9, the larger the central angle θ, and the shallower the depth d1 of the recessed portions 9, the smaller the central angle θ.

In the present embodiment, light emitted under an electrical field is UV light or blue light as described above. However, most of light is emitted to the outside through the filling layer 12. Therefore, light emitted to the outside by excitation of a phosphor contained in the filling layer 12 is a light emitting component of the phosphor. In light emission of the phosphor, light is usually emitted uniformly to all directions. However, the light emitting component is not sealed and is guided and emitted to the outside by the recessed portion structure according to one aspect of the disclosure.

In the organic EL device 100 of the present embodiment, even when the light emitting area U in each of the unit regions 11 is decreased, high brightness can be achieved due to the recessed portion structure described above being provided in the light emitting area U. Furthermore, even when the light emitting area U is small, a necessary brightness can be achieved. Therefore, burden of light emitting element can be decreased and power consumption can be decreased. Accordingly, the lifetime of the element is increased.

For verification of effects of the organic EL device 100 of the present embodiment, the inventors prepared elements of an example and a comparative example, and compared the viewability of the elements.

Figure 15A:
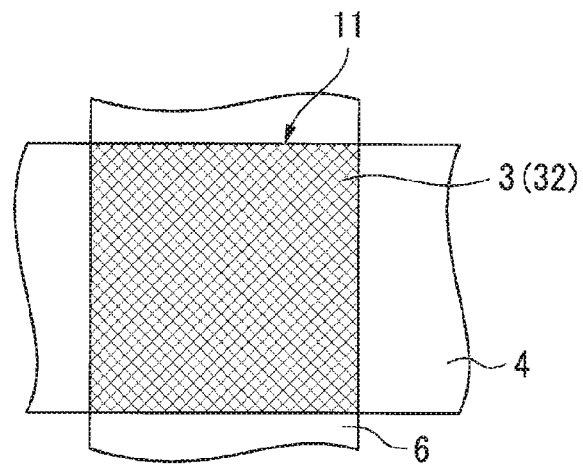
FIG. 15A is a plan view of an organic EL element of a comparative example.
Figure 15B:
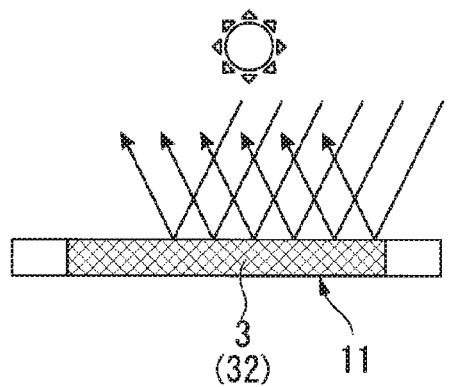
FIG. 15B is a view of the organic EL element of a comparative example, and illustrates a reflection state.
Figure 16A:
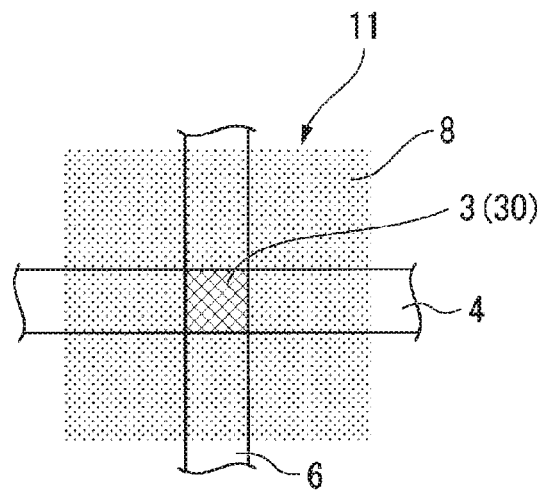
FIG. 16A is a plan view of an organic EL element of an example.
Figure 16B:
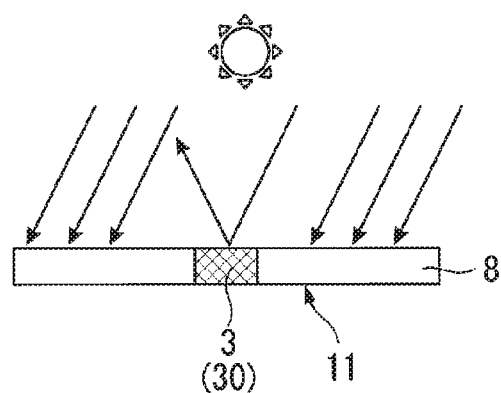
FIG. 16B is a view of the organic EL element of an example, and illustrates a reflection state.

FIGS. 15A and 15B are views of an organic EL element of a comparative example. FIG. 15A is a plan view of the organic EL element, and FIG. 15B is a view illustrating a reflection state. FIGS. 16A and 16B are views of an organic EL element of an example. FIG. 16A is a plan view of the organic EL element, and FIG. 16B is a view illustrating a reflection state.

As illustrated in FIG. 15A, an organic EL element 32 of the comparative example is formed in substantially on an entire region of the unit region 11 of 10000 μm², and has the reflective layer 3 (8100 μm²) of 90-μm square.

As illustrated in FIG. 16A, an organic EL element 30 of the example is formed in a portion of the unit region 11 of 10000 μm², and has the reflective layer 3 (400 μm²) of 20-μm square.

As the light emitting material, a green light emitting material is used. In both the organic EL elements, light with a brightness of 500 cd/m² is emitted.

As a result, light emission of the organic EL element 32 of the comparative example due to reflection of sun light almost cannot be recognized. In contrast, in the organic EL element 30 of the example, green light emission is recognized. This shows improvement of viewability under bright light outdoors.

In the organic EL device 100 of the present embodiment, a region other than the light emitting area U in each of the unit regions 11 is black due to the presence of the light absorption layer 8. Therefore, the appearance of a display is black. In the light absorption area K where the light absorption layer 8 exists, the external light can be absorbed to suppress the reflection.

In the configuration of the comparative example, the organic EL element 32 (reflective layer 3) is formed substantially in the entire region of the unit regions 11 (FIG. 15A). Therefore, sunlight is reflected by substantially the entire region of the unit regions 11 (FIG. 15B).

In contrast, in the present embodiment, the organic EL element 30 (reflective layer 3) is only formed in a portion of the unit regions 11, and the light absorption layer 8 exists in the other region.

The unit regions 11 each have a size of 100-μm square and the area thereof is 10000 μm².

On the other hand, the reflective layer 3 has a size of 20-μm square and the area thereof is only 400 μm². That is, the proportion of the reflective layer 3 in each of the unit regions 11 is only 4%. The proportion of the reflected light relative to all incident sunlight is 4%. The remaining 96% light is absorbed into the light absorption layer 8. According to the element configuration in the example, most of incident sunlight can be absorbed into the light absorption layer 8, and the reflection of the external light can be largely suppressed.

Thus, according to the configuration of the present embodiment, the organic EL device 100 having favorable viewability can be obtained.

Second Embodiment

Next, a description follows regarding an organic EL device of a second embodiment of the disclosure.

A basic configuration of the organic EL device of the present embodiment as described later is substantially the same as that of the first embodiment except that a contact portion between an active element and each wiring line is a light emitting area. In the following description, configuration different from the embodiment described above will be described in detail. The description of common configuration will be omitted. In each drawing used in the description, components that are the same as those in FIGS. 1 to 16B will be assigned the same reference numerals.

Figure 17:
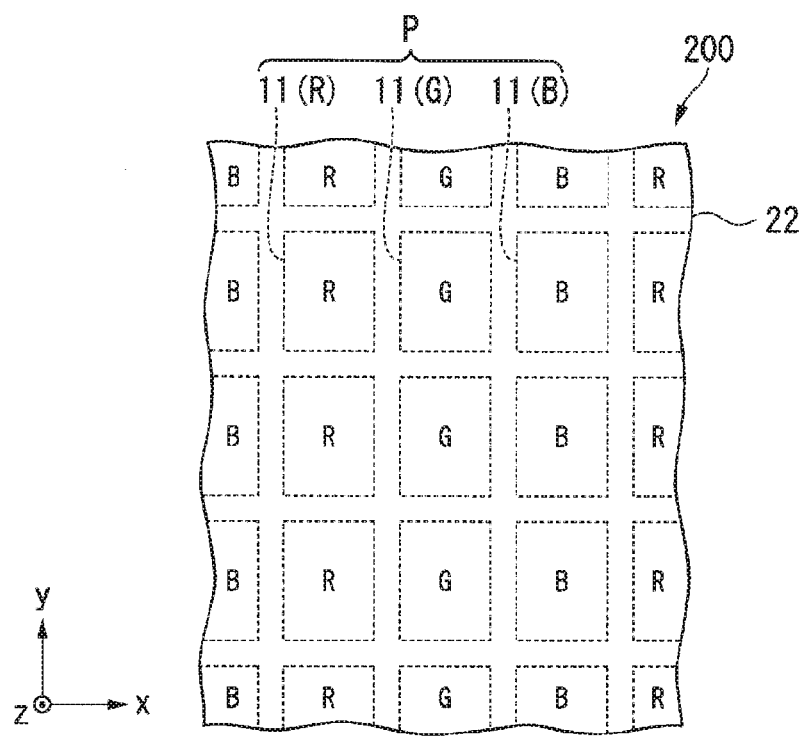
FIG. 17 is a plan view of a portion of a display region in an organic EL element according to a second embodiment.

FIG. 17 is a plan view of a portion of a display region in an organic EL element according to the second embodiment.

Figure 18:
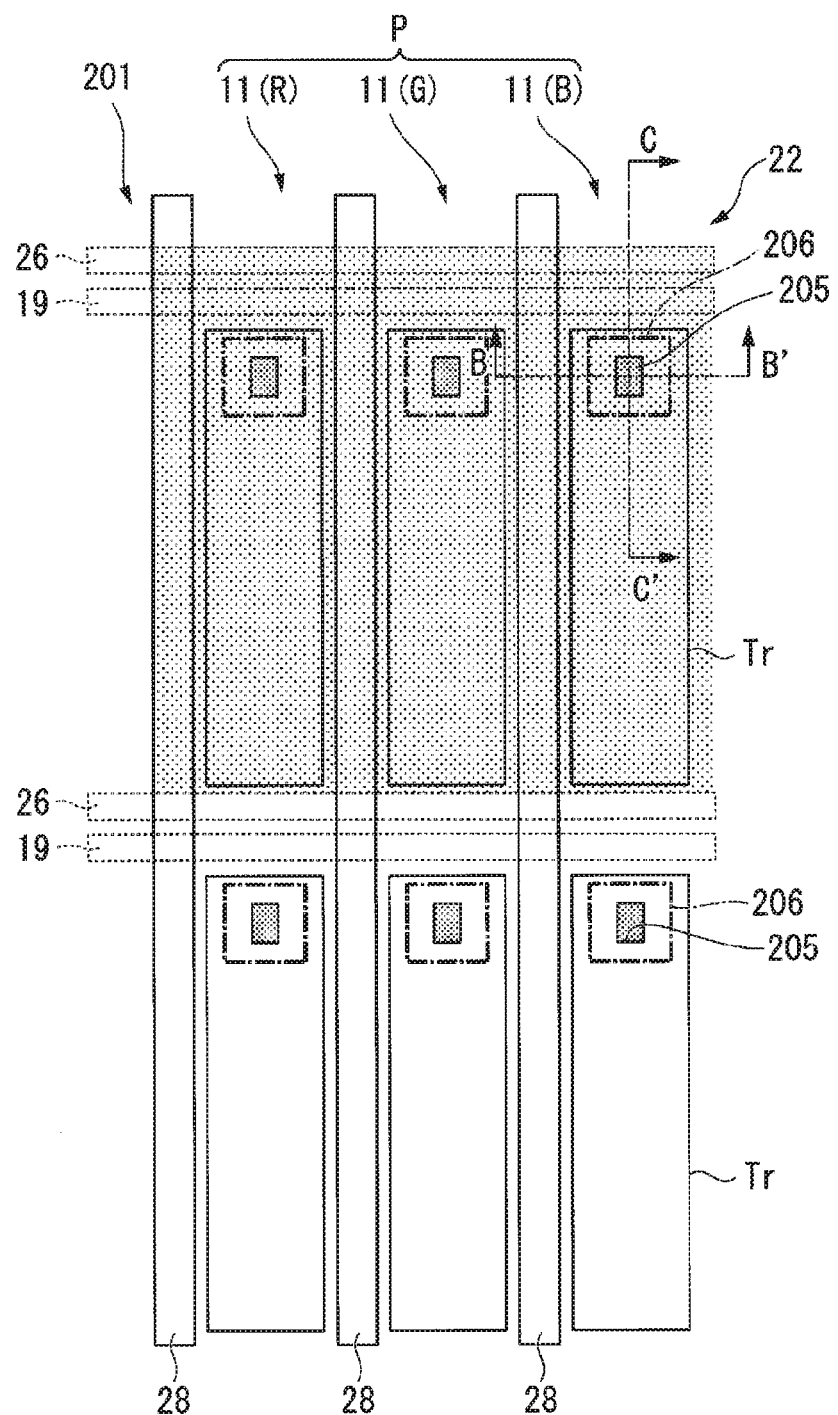
FIG. 18 is a plan view illustrating a configuration of each pixel in the organic EL element according to the second embodiment.

FIG. 18 is a plan view of a configuration of each pixel in the organic EL element according to the second embodiment.

Figure 19A:
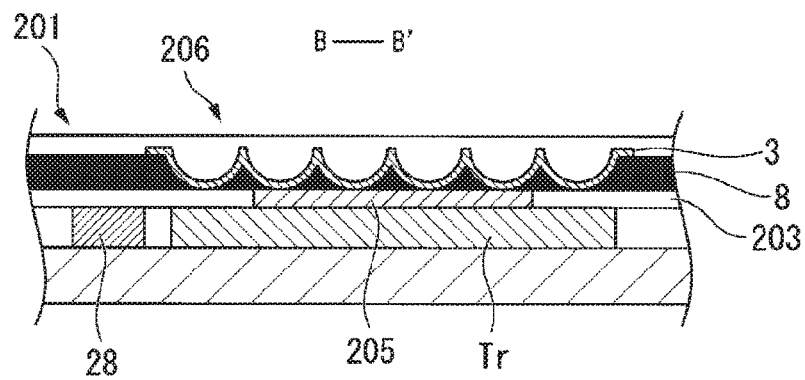
FIG. 19A is a cross-sectional view taken along line B-B' in FIG. 18.
Figure 19B:
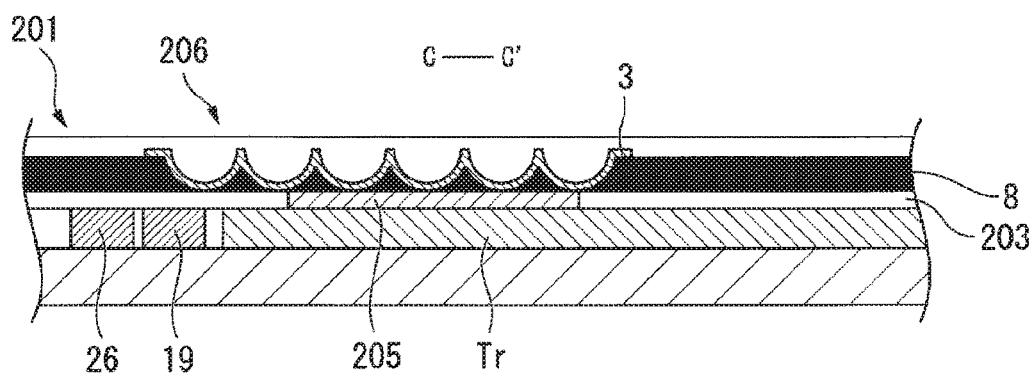
FIG. 19B is a cross-sectional view taken along line C-C' in FIG. 18.
Figure 20:
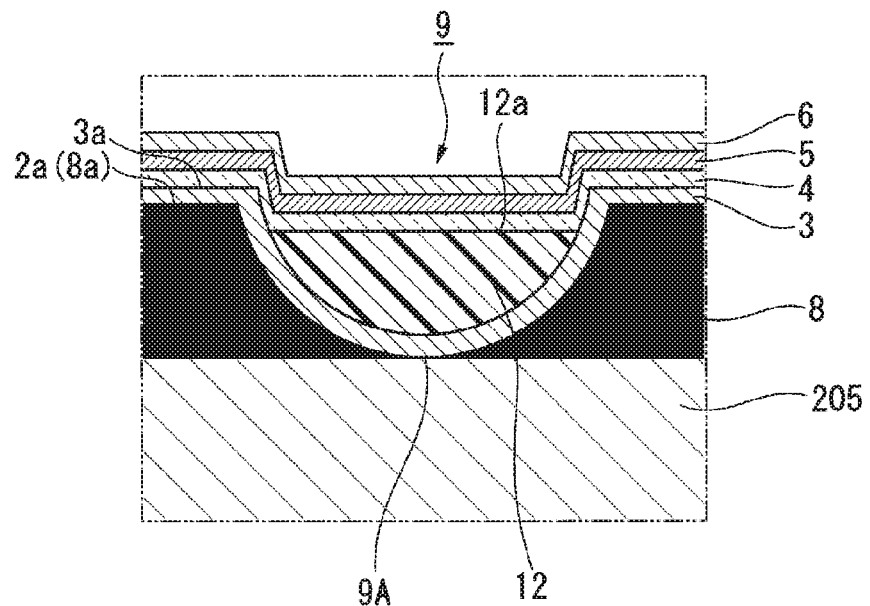
FIG. 20 is an enlarged cross-sectional view of a main portion in a light emitting element portion.

FIG. 19A is a cross-sectional view taken along line B-B' in FIG. 18, and FIG. 19B is a cross-sectional view taken along line C-C' in FIG. 18. FIG. 20 is an enlarged cross-sectional view of a main portion in a light emitting element portion.

As illustrated in FIG. 17, an organic EL device (display device) 200 of the present embodiment is a display device having a display region 22 in which a plurality of pixels P are arranged in a matrix. The pixels P each include three sub pixels (unit regions) 11 of RGB arranged in turn in a horizontal direction of the display region 22. A red sub pixel 11R emits red light, a green sub pixel 11G emits green light, and a blue sub pixel 11B emits blue light. The red sub pixel 11R, the green sub pixel 11G, and the blue sub pixel 11B each have a light emitting element portion 206.

The light emitting element portions 206 in each of the sub pixels 11 have the same configuration except that fluorescent materials contained in the filling layers are different. Each of the pixels P has, for example, a size of 120-μm square.

As viewed from a display face side, the light absorption layer 8 exists in a region other than the light emitting element portion 206 in each of the sub pixels 11.

Each of the red sub pixel 11R, the green sub pixel 11G, and the blue sub pixel 11B can be independently driven (application of electrical field). As a procedure for independently applying a voltage to the sub pixels, any procedure using a simple matrix electrode, segment division, or an SW substrate such as a TFT can be performed.

In the present embodiment, one pixel is divided into three sub pixels 11, and each of the sub pixels 11 is independently driven. Any color can be displayed according to a method for emitting light in each of the sub pixels 11.

As illustrated in FIG. 18, the organic EL device 200 of the present embodiment includes a display panel including an active matrix substrate 201, a plurality of thin film transistors (active elements) Tr that are provided in an predetermined arrangement corresponding to the plurality of sub pixels 11 in the display region 22, various wiring lines connected to each of the thin film transistors Tr, and a sealing substrate (not illustrated) configured to cover the plurality of thin film transistors Tr and the wiring lines.

In the active matrix substrate 201, a plurality of gate lines (scanning lines) 28 that extend in parallel, a plurality of source lines (data lines) 19 that extend in parallel in a direction intersecting each of the gate lines 28, and a plurality of current-supplying wiring lines 26 that extend along the source lines 19 are provided in the display region 22 as a drive circuit for driving the display panel. Herein, the gate lines 28 and the source lines 19 insulate each other, and are formed in a lattice as a whole so that each of the sub pixels 11 is configured.

The gate lines 28, the source lines 19, and the current-supplying wiring lines 26 are formed in a width of 3 µm from a metal layer of Ti/Al/Ti. Each wiring line portion is a non emissive region.

The thin film transistors (active elements) Tr for switching that are electrically connected are provided at each intersection between the gate lines 28 and the source lines 19. As the thin film transistors Tr, publicly known thin film transistors can be employed. In the present embodiment, a 2Tr1C configuration including two thin film transistors Tr and one capacitor is used.

In the present embodiment, a semiconductor film of each of the thin film transistors Tr can be formed from an oxide semiconductor. For example, the semiconductor film may contain at least one metal element of In, Ga, and Zn. In the present embodiment, the semiconductor film contains, for example, an In-Ga-Zn-O-based semiconductor. Herein, the In-Ga-Zn-O-based semiconductor is a ternary oxide including indium (In), gallium (Ga), and zinc (Zn). The ratio (composite ratio) of In, Ga, and Zn is not particularly limited, and for example, includes In:Ga:Zn of 2:2:1, 1:1:1, and 1:1:2. Such an oxide semiconductor film may be formed from an oxide semiconductor film including the In—Ga—Zn—O-based semiconductor.

A channel etching TFT having an active layer containing the In—Ga—Zn—O-based semiconductor is sometimes referred to as "CE—InGaZnO-TFT". The In—Ga—Zn—O-based semiconductor may be amorphous or crystalline. It is preferable that a crystalline In—Ga—Zn—O-based semiconductor be a crystalline In—Ga—Zn—O-based semiconductor in which a c axis is oriented so as to be substantially vertical to a layer face.

In the embodiment described above, the semiconductor film of each of the thin film transistors Tr that is formed from a compound (In—GA—Zn—O) containing indium (In), gallium (Ga), zinc (Zn), and oxygen (O) is described. However, the disclosure is not limited to this embodiment. A semiconductor layer of each of the thin film transistors Tr may be formed from a compound (In—Tin—Zn—O) containing indium (In), tin (Tin), zinc (Zn), and oxygen (O), or a compound (In—Al—Zn—O) containing indium (In), aluminum (Al), zinc (Zn), and oxygen (O). The semiconductor film of each of the thin film transistors Tr may be formed from an amorphous silicon, a low-temperature polysilicon, or the like.

As illustrated in FIGS. 19A and 19B, the contact portion 205 is formed in an interlayer insulating layer 203 that covers each of the thin film transistors Tr and various wiring lines. The contact portion 205 is a portion where each thin film transistor Tr is electrically connected to the light emitting element portion 206. The contact portion 205 is a non emissive region that has a 20-µm square as viewed in plan view.

The light absorption layer 8 is formed on the interlayer insulating layer 203 including the contact portion 205. The light absorption layer 8 is formed substantially in an entire region of the display region 22. In the light absorption layer 8, a plurality of recessed portions 9 are formed in a region corresponding to the light emitting element portion 206 in each of the sub pixels 11.

As illustrated in FIG. 20, the light emitting element portion (light emitting element) 206 is formed so as to include the plurality of recessed portions 9 formed in the light absorption layer 8. The light emitting element portion 206 is configured to have the reflective layer 3, the filling layer 12, the first electrode 4, the organic layer 5, and the second electrode 6. In the present embodiment, an opening 9A is provided on a bottom side of some of the recessed portions 9 positioned above the contact portion 205. The contact portion 205 on a lower layer side is electrically connected to the reflective layer 3 through each of the openings 9A.

The light emitting element portion 206 has a size of 35-µm square as viewed in plan view. The organic layer 5 emits light with color of the corresponding sub pixel 11.

The first electrode 4 is formed in a 35-µm square and has the substantially same size as that of the reflective layer 3. Similar to the embodiment described above, the first electrode 4 is in contact with a portion of the reflective layer 3.

In the present embodiment, the thin film transistors Tr are each electrically connected to the light emitting element portion 206 through the reflective layer 3 and the contact portion 205. The light emitting element portion 206 can thus emit light through each of the thin film transistors Tr.

In the organic EL device 200 of the present embodiment, the light absorption layer 8 that is black is present in the region other than the light emitting element portion 206 in each of the sub pixels 11 . Thus, the appearance of a display is substantially black. The source lines 19, the gate lines 28, and the current-supplying wiring lines 26 are formed in a lower layer of the light absorption layer 8. Therefore, these various wiring lines are not directly visible from the appearance. A proportion of the reflective layer 3 in the display region 22 is lower than a proportion of the light absorption layer 8. Therefore, a reflection region can be decreased. When the thin film transistors Tr, the wiring lines, and the like are covered with the light absorption layer 8, reflection of light by the varies wiring lines formed from a metal layer is prevented. Thus, viewability can be largely improved due to the decreased in reflection region and the suppression of the reflection of external light by the metal layer being covered with the light absorption layer 8.

In the present embodiment, each of the sub pixels 11 has an area of 4800 µm$^2$ with a length of 120 µm and a width of 40 µm. On the other hand, the reflective layer 3 has an area of 400 μm² of 20 μm square. The proportion of the reflective layer 3 in each of the sub pixels 11 is 8.3%. That is, 91.7% of sunlight incident on the sub pixels is absorbed into the light absorption layer 8, and thus is not reflected.

In the present embodiment, the contact portion 205 formed from the metal layer and a periphery thereof are covered with the light emitting element portion 206. Therefore, the non emissive area can be changed to the light emitting area U. The light emitting element portion 206 of the present embodiment can emit light with high brightness due to the recessed portion structure described above. Therefore, the light emitting area U within the sub pixels 11 can be decreased. Accordingly, the proportion of the light absorption layer 8 in the sub pixels 11 can be increased, and a larger amount of sunlight can be absorbed into the light absorption layer 8.

In the present embodiment, the light-emitting efficiency of the light emitting element portion 206 is not less than twice that of a structure in the related art that does not include the recessed portion structure. Therefore, even when the light emitting area U within the sub pixels 11 is decreased, the brightness of the display can be maintained.

For verification of effects of the organic EL device of the present embodiment, the inventors prepared elements of an example and a comparative example, and compared the viewability of the elements.

In the example, an element in which a recessed portion 9 is formed in a light absorption layer 8 that is black is used.

In the comparative example, an element in which a recessed portion 9 is formed in a transparent resin layer is used.

Both the elements emit white light with a brightness of 500 cd/m². In the element of the comparative example, emission of white light by a light emitting element portion cannot be almost recognized due to the reflection of sunlight. In the element of the example, light emission by the light emitting element portion can be recognized. As a result, improvement of viewability in bright light of the outside can be confirmed.

Third Embodiment

A description follows regarding an organic EL device of a third embodiment of the disclosure.

A basic configuration of the organic EL device of the present embodiment as described later is substantially the same as that of the first embodiment except that an antireflective layer is provided on a surface. In the following description, configuration different from the first embodiment will be described in detail. The description of common configuration will be omitted. In each drawing used in the description, components that are the same as those in FIGS. 1 to 20 will be assigned the same reference numerals.

Figure 21:
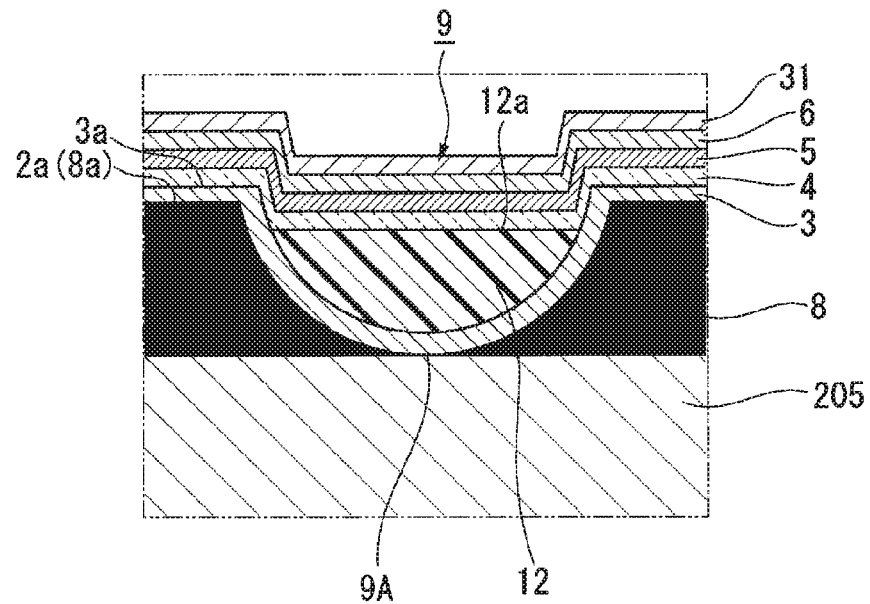
FIG. 21 is a cross-sectional view of a main portion in an organic EL device according to a third embodiment

FIG. 21 is a cross-sectional view of a main portion in the organic EL device of the third embodiment As illustrated in FIG. 21, the organic EL device of the present embodiment has an antireflective layer 31 on an outermost surface of the light emitting element portion 206. Specifically, the antireflective layer 31 is provided on a surface of the second electrode 6. As the antireflective layer 31, an antireflective (AR) coating film can be used. In addition, a dielectric material-multilayer film, a refractive index-controlling film with a nanostructure (moth eye film), or the like can be employed. The type thereof is not limited.

The antireflective layer 31 can be applied to not only the configuration of the first embodiment but also to the configuration of the second embodiment. The antireflective layer 31 is useful in eliminating surface reflection of light in the organic EL element 30 or the light emitting element portion 206 of each of the embodiments described above.

Occurrence of the surface reflection of light in the organic EL element 30 or the light emitting element portion 206 depends on the refractive index of a material constituting the outermost surface. However, the reflection occurs at approximately 4% to 10%. Even when the internal reflection in each of the unit regions or the sub pixels is reduced due to the light absorption layer 8, the viewability is significantly reduced due to the surface reflection. In particular, the viewability in a slightly oblique direction is significantly reduced. Therefore, when the antireflective layer 31 is provided on the outermost surface of the organic EL element 30 or the light emitting element portion 206 as in the present embodiment, the surface reflection can be reduced, and the viewability can be improved.

For verification of effects of the present embodiment, the inventors prepared elements of an example and a comparative example, and compared the viewability of the elements.

In the example, an organic EL element having the antireflective layer 31 on the outermost surface is used.

In the comparative example, an organic EL element without the antireflective layer 31 is used.

Both the elements are prepared based on the element configuration of the organic EL element of the first embodiment, and emit light with a brightness of 500 cd/m².

As a result, in both the elements, the light-emitting color can be visually recognized; however, the element having the antireflective layer 31 of the example has slightly better viewability. As viewed in a slightly oblique direction, the surface reflection in the element of the comparative example is strong, and the viewability is reduced. The viewability in the element of the example is not reduced.

Fourth Embodiment

A description follows regarding an organic EL device of a fourth embodiment of the disclosure.

A basic configuration of the organic EL device of the embodiment described later is substantially the same as that of the second embodiment except that an organic EL element that emits white light is provided and a color filter substrate is provided. In the following description, configuration different from the second embodiment will be described in detail. The description of common configuration will be omitted. In each drawing used in the description, components that are the same as those in FIGS. 17 to 20 will be assigned the same reference numerals.

Figure 22:
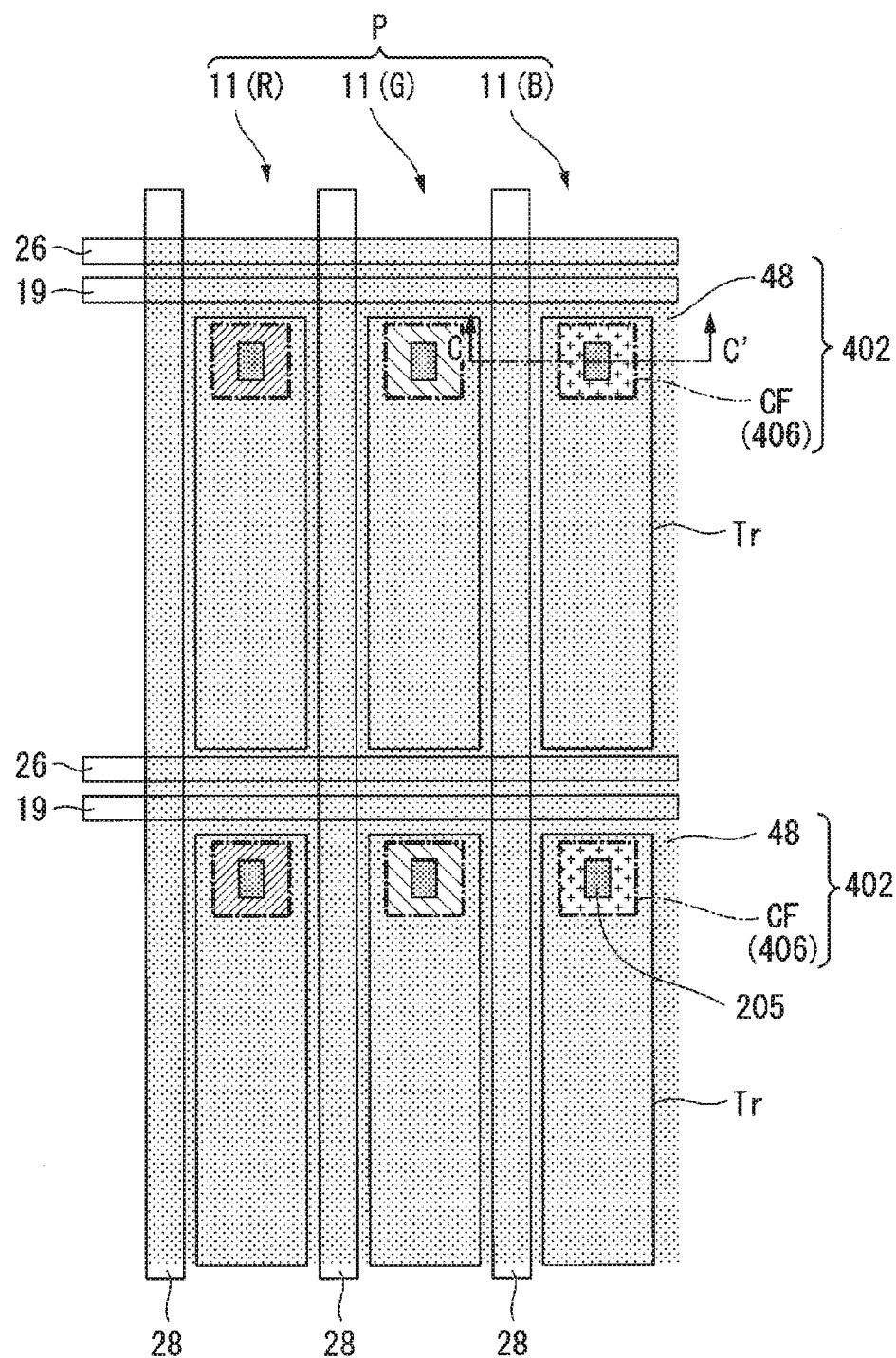
FIG. 22 is a view of a display region of an organic EL device according to a fourth embodiment.
Figure 23:
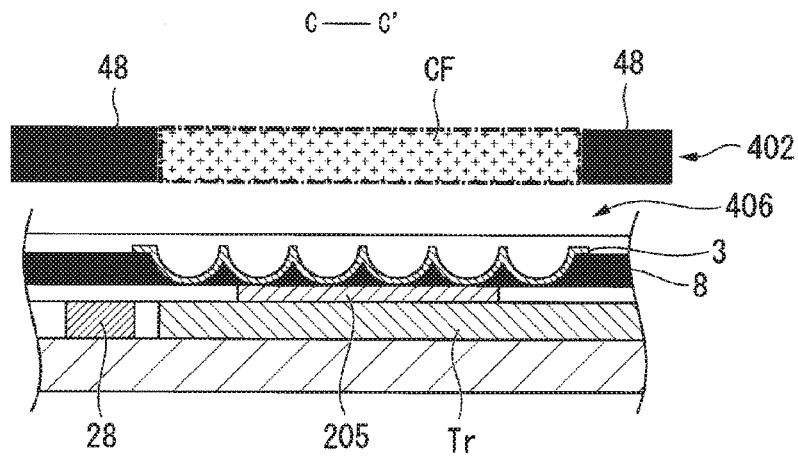
FIG. 23 is a cross-sectional view taken along line C-C' in FIG. 22.

FIG. 22 is a view of a display region of the organic EL device of the fourth embodiment. FIG. 23 is a cross-sectional view taken along line C-C' in FIG. 22.

As illustrated in FIGS. 22 and 23, the organic EL element of the present embodiment includes an active matrix substrate 401 including a thin film transistor Tr that corresponds to each of the sub pixels 11 and has a transparent semiconductor layer, and a white light emitting element portion (light emitting element) 406, and a color filter substrate 402.

The color filter substrate 402 includes a color filter CF of each color of RGB corresponding to the sub pixels 11, and a light absorption portion (light absorption layer) 48 that partitions each of the color filters CF. The color filter CF of each color is disposed on the light emitting element portion 406, and has such a size that the light emitting element portion 406 is covered. The area of each of the color filters CF is substantially the same as that of a region where the reflective layer 3 is provided. Of the color filter substrate 402, a region other than each of the color filters CF is constituted by the light absorption layer 8.

In the present embodiment, the color filter substrate 402 is produced separately from the active matrix substrate 402, and the active matrix substrate 401 and the color filter substrate 402 are bonded. Thus the organic EL device is obtained.

A production method is not limited to the method described above. The organic EL device may be produced, for example, by forming a protection layer on the light emitting element portion 406 and applying each of the color filters CF and the light absorption portion 48 on the protection layer. Alternatively, the color filter CF and the light absorption layer 8 may be produced by film forming a mask pattern through deposition.

The light emitting element portion 406 is a white light emitting element that emits white light. The light emitting element portion 406 is formed on a plurality of recessed portions 9 formed on the light absorption layer 8 that is black.

Next, a configuration of the emitting element portion 406 that emits white light will be described in detail.

The light emitting element portion 406 of the present embodiment has an organic layer 35 that emits white light in each of the recessed portions 9. The organic layer 35 that emits white light is configured to have a first light emitting unit (EMU1) 39B that emits blue light, and a second light emitting unit (EMU2) 39RG that emits green and red light.

The organic layer 35 that emits white light is configured to have the first light emitting unit (EMU1) 39B that emits blue light, and the second light emitting unit (EMU2) 39RG that emits green and red light.

Figure 24A:
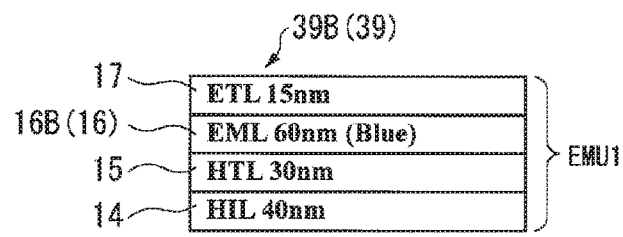
FIG. 24A is a view illustrating a configuration of a blue light emitting unit.
Figure 24B:
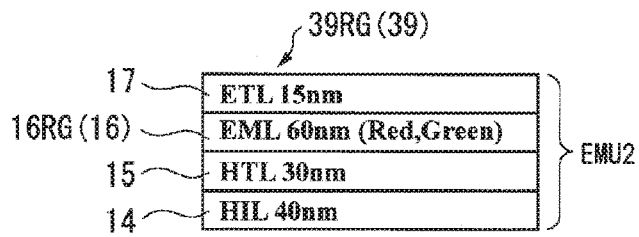
FIG. 24B is a view illustrating a configuration of a green and red light emitting unit.
Figure 24C:
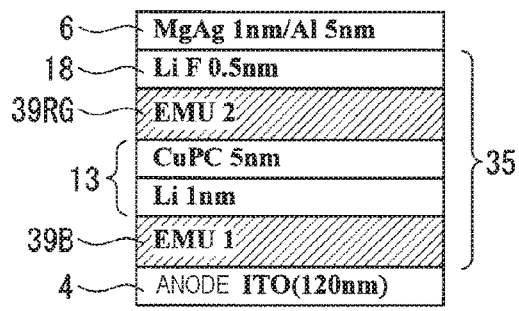
FIG. 24C is a view illustrating a configuration of a light emitting element portion that emits white light.

FIG. 24A is a view illustrating a configuration of a blue light emitting unit. FIG. 24B is a view illustrating a configuration of a green and red light emitting unit. FIG. 24C is a view illustrating a configuration of a light emitting element portion that emits white light.

In the present embodiment as illustrated in FIGS. 24A and 24B, a light emitting unit (EMU) 19 has a structure in which a hole injecting layer (HIL) 14 having a film thickness of 40 nm, a hole transport layer (HTL) 15 having a film thickness of 30 nm, a light emitting layer (EML) 16 having a film thickness of 60 nm, and an electron transport layer (ETL) having a film thickness of 15 nm are layered.

In the present embodiment, the first light emitting unit (EMU1) 39B having a blue light-emitting layer 16B in which a blue light-emitting material is doped, as illustrated in FIG. 24A, and the second light emitting unit (EMU2) 39RG having a green light-emitting layer 16G in which a green light-emitting material is doped and a red light-emitting layer 16R in which a red light-emitting material is doped, as illustrated in FIG. 24B, are provided.

In the second light emitting unit 39RG, the green light-emitting layer 16G and the red light-emitting layer 16R are layered in this order.

As illustrated in FIG. 24C, the light emitting element portion 406 including the organic layer 35 that emits white light in each of the recessed portions 9 includes both the blue light emitting unit and the green and red light emitting unit. Thus, white light emission can be achieved.

The light emitting element portion 406 of the present embodiment has a configuration in which the first light emitting unit 39B, a lithium (Li) layer, a copper phthalocyanine complex (CuPC) layer, the second light emitting unit 39RG, a lithium fluoride (LiF) layer, and the second electrode 6 are layered in this order on the first electrode 4 in each of the recessed portions 9. As a charge generating layer 13, the lithium (Li) layer having a film thickness of 1 nm and the copper phthalocyanine complex (CuPC) layer having a film thickness of 5 nm are provided. The first light emitting unit 39B and the second light emitting unit 39RG are layered in two layers with the charge generating layer 13 as an intermediate layer.

The first electrode 4 is formed from an ITO having a film thickness of 120 nm. A lithium fluoride (LiF) layer having a film thickness of 0.5 nm functions as the electron injecting layer 18.

Figure 25:
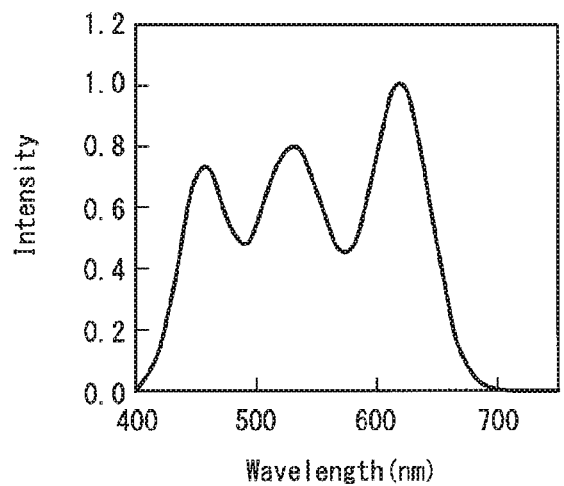
FIG. 25 is a graph illustrating a light emission spectrum in the light emitting element portion that emits white light.

FIG. 25 is a graph illustrating a light emission spectrum in the light emitting element portion that emits white light. Herein, AL of the second electrode 6 in the light emitting element portion 406 has a film thickness of 100 nm.

In the present embodiment, a microcavity effect due to the recessed portion structure is not obtained. Therefore, the light emission spectrum illustrated in FIG. 25 exhibits a basic property.

In the present embodiment, the color filters CF are each provided on the light emitting element portion 406 that emits white light. Thus, a color display element is produced. In a high-resolution display having a resolution of greater than 400 ppi, it is difficult to apply each organic EL element of RGB in each of sub pixels separately. On the other hand, the precision of each of the color filters CF can be up to approximately 600 ppi. According to the configuration of the present embodiment, a display with high resolution can be obtained.

In general, the transmittance is significantly decreased due to the presence of the color filters CF. However, according to the configuration of the present embodiment, the color filters CF are provided only in a light emitting area (light emitting element portion 406). Therefore, a decrease in transmittance can be prevented.

In the organic EL device of the present embodiment, the same transmittance as in the second embodiment can be obtained.

In the present embodiment, a non emissive region that is a region other than the light emitting element portion 406 is covered with the light absorption portion 48 of the color filter substrate 402. Therefore, the appearance of a display is substantially black. Similar to the embodiments described above, wiring lines formed from a metal layer on the active matrix substrate are covered with the light absorption layer 8. Therefore, the wiring lines are not directly visible from the appearance.

Accordingly, most of incident sunlight is absorbed into the light absorption portion 48 of the color filter substrate 402 provided on a surface side of the display. This can suppress the reflection of external light.

The inventors verified effects of the organic EL device of the present embodiment, and the viewability identical to that of the second embodiment can be obtained. In the present embodiment, the light emitting region is restricted. Therefore, color mixture due to stray light, which often occurs in white light emission, does not occur, and the color purity is improved.

Figure 26:
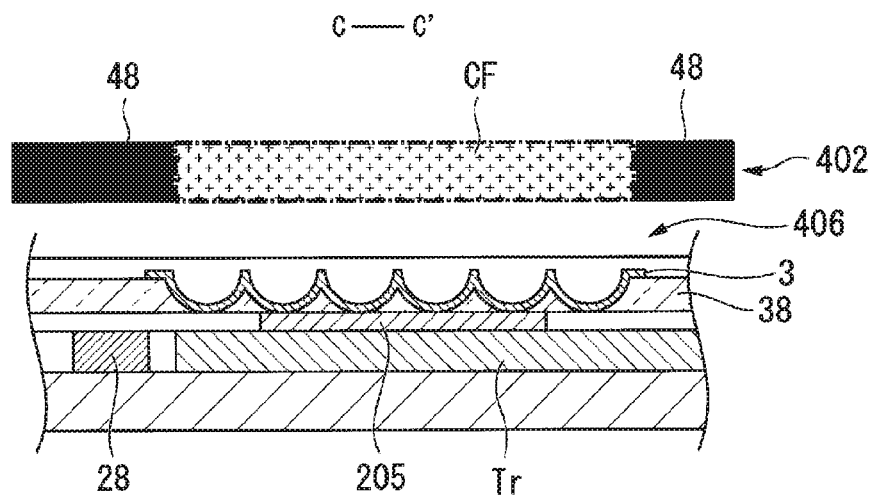
FIG. 26 is a view of a modification of the organic EL device according to the fourth embodiment.

The configuration is not limited to the configuration of the present embodiment. In a case where the color filter substrate 402 having the light absorption portion 48 is provided, the light absorption layer 8 may not be provided on the active matrix substrate side. As illustrated in FIG. 26, the light emitting element portion 406 (recessed portion 9) may be formed in a transparent resin layer 38.

Although the preferred embodiments of the disclosure have been described with reference to the accompanying drawing, the disclosure is not limited to such embodiments. It is apparent to those skilled in the art that various alternations or modifications can be made in the category of technical sprit as set forth in the claims, and it will be understood that these alternations or modifications naturally falls within the technical scope of the disclosure.

In each of the embodiments, the light emitting element has the plurality of recessed portions. However, the light emitting element may have only single recessed portion.

Although a description has been given in the embodiments above regarding examples of cases in which the cross-sectional shape of the recessed portion is a circular arc, the cross-sectional shape of the recessed portion need not be a circular arc. The cross-sectional shape of the recessed portions may include, for example, an ellipse or any curved line, or may partially include a straight line.

In addition, specific configuration such as the shape, dimensions, number, disposition, configuration materials, and forming processes of each portion of the organic EL device are not limited to the embodiments above, and may be appropriately modified.

Moreover, the organic EL device according to one aspect of the disclosure may be applied to an illuminating device or the like in addition to the display device. For example, when one aspect of the disclosure is applied to an illumination device that generates white light, the illumination device may not be divided into a plurality of unit regions separated from each other and emit light of different color, as illustrated in the embodiment described above.

Specifically, three kinds of dopant colorant of red, green, and blue may be doped in one light emitting layer, a layered structure including a hole-transporting blue light-emitting layer, an electron-transporting green light-emitting layer, and an electron-transporting red light-emitting layer may be provided, or a layered structure including an electron-transporting blue light-emitting layer, an electron-transporting green light-emitting layer, and an electron-transporting red light emitting-layer may be provided.

INDUSTRIAL APPLICABILITY

Some aspects of the disclosure can be applied to an organic electroluminescence device, an illumination device, and a display device in which reflection of external light needs to be reduced to improve the viewability.

REFERENCE SIGNS LIST

2 Base material
2a Upper face
3 Reflective layer
4 First electrode
5 Organic layer
5b Lower face
6 Second electrode
8 Light absorption layer
9 Recessed portion
Q Plane
U Light emitting area
10, 22 Display region
11 (11B, 11G, 11R) Sub pixel (unit region)
12 Filling layer
16 Light-emitting layer
30 Organic EL element (light emitting element)
31 Antireflective layer
48 Light absorption portion (light absorption layer)
CF Color Filter
L1 Light
Tr Thin film transistor (active element)

100, 200 Organic EL display device (organic electroluminescence device, illumination device, display device)
206, 406 Light emitting element portion (light emitting element)

The invention claimed is:
1. A display device comprising:
a base material including a recessed portion on one face side; and
a light emitting element including:
a reflective layer being disposed at least on a surface of the recessed portion,
a filling layer having optical transparency, the filling layer being filled at an inside of the recessed portion via the reflective layer,
a first electrode having optical transparency, the first electrode being disposed at least on an upper-layer side of the filling layer,
an organic layer including at least a light emitting layer, the organic layer being disposed on an upper-layer side of the first electrode, and
a second electrode having optical transparency, the second electrode being disposed on an upper-layer side of the organic layer, wherein
a display region includes a plurality of unit regions separated from each other,
each of the plurality of unit regions includes a light emitting area and a non-emissive area being partitioned,
the light emitting element is provided in the light emitting area,
the non-emissive area includes a light absorption layer,
the light absorption layer is provided between the base material and the reflective layer in the light emitting area and the non-emissive area, and
the light absorption layer in the light emitting area includes the recessed portion.
2. The display device according to claim 1, wherein
a color filter substrate including a color filter and the light absorption layer is disposed on the base material,
the color filter corresponds to the light emitting area, and
the light absorption layer partitions the color filter and corresponds to the non-emissive area.
3. The display device according to claim 1, wherein the light emitting area and the non-emissive area satisfy a ratio of the light emitting area to the light emitting area and the non-emissive area of less than 50%.
4. The display device according to claim 1, wherein
the recessed portion includes a plurality of recessed portions,
the plurality of recessed portions are disposed in the light emitting area, and
the reflective layer is disposed in the plurality of recessed portions.
5. The display device according to claim 1, wherein a portion of the reflective layer is in contact with a portion of the first electrode.
6. The display device according to claim 1, wherein a lower face of the first electrode at a position inside the recessed portion is positioned lower than a plane including one face side of the base material.
7. The display device according to claim 1, wherein
the light emitting area includes a plurality of active elements,
the plurality of active elements independently control light emission, and the plurality of active elements are electrically connected to the light emitting element through the reflective layer.

8. The display device according to claim 7, wherein the plurality of active elements are made of an oxide semiconductor.

9. The display device according to claim 1, further comprising:
an antireflective layer disposed on the light emitting element.

10. A display device comprising:
a base material including a recessed portion on one face side; and
a light emitting element including:
a reflective layer being disposed at least on a surface of the recessed portion,
a filling layer having optical transparency, the filling layer being filled at an inside of the recessed portion via the reflective layer,
a first electrode having optical transparency, the first electrode being disposed at least on an upper-layer side of the filling layer,
an organic layer including at least a light emitting layer, the organic layer being disposed on an upper-layer side of the first electrode, and
a second electrode having optical transparency, the second electrode being disposed on an upper-layer side of the organic layer, wherein
a display region includes a plurality of unit regions separated from each other,
each of the plurality of unit regions includes a light emitting area and a non-emissive area being partitioned,
the light emitting element is provided in the light emitting area,
the non-emissive area includes a light absorption layer,
a resin layer including the recessed portion, and the light absorption layer disposed along an upper face of the resin layer including the recessed portion are disposed on the base material.

11. The display device according to claim 10, wherein
a color filter substrate including a color filter and the light absorption layer is disposed on the base material,
the color filter corresponds to the light emitting area, and the light absorption layer partitions the color filter and corresponds to the non-emissive area.

12. The display device according to claim 10, wherein the light emitting area and the non-emissive area satisfy a ratio of the light emitting area to the light emitting area and the non-emissive area of less than 50%.

13. The display device according to claim 10, wherein
the recessed portion includes a plurality of recessed portions,
the plurality of recessed portions are disposed in the light emitting area, and
the reflective layer is disposed in the plurality of recessed portions.

14. The display device according to claim 10, wherein a portion of the reflective layer is in contact with a portion of the first electrode.

15. The display device according to claim 10, wherein a lower face of the first electrode at a position inside the recessed portion is positioned lower than a plane including one face side of the base material.

16. The display device according to claim 10, wherein
the light emitting area includes a plurality of active elements,
the plurality of active elements are configured to independently control light emission, and
the plurality of active elements are electrically connected to the light emitting element through the reflective layer.

17. The display device according to claim 16, wherein the plurality of active elements are made of an oxide semiconductor.

18. The display device according to claim 10, further comprising:
an antireflective layer disposed on the light emitting element.

19. An illumination device comprising:
a base material including a recessed portion on one face side;
a light emitting element including:
a reflective layer disposed at least along a surface of the recessed portion;
a filling layer having optical transparency, the filling layer being filled at an inside of the recessed portion via the reflective layer;
a first electrode having optical transparency, the first electrode being at least on an upper-layer side of the filling layer;
an organic layer including at least a light emitting layer, the organic layer being disposed on an upper-layer side of the first electrode; and
a second electrode having optical transparency and light reflectivity, the second electrode being disposed on an upper-layer side of the organic layer, and
a display region including a plurality of unit regions separated from each other, wherein
each of the plurality of unit regions includes a light emitting area and a non-emissive area that is partitioned,
the light emitting element is provided in the light emitting area,
the non-emissive area includes a light absorption layer,
the light absorption layer is provided between the base material and the reflective layer in the light emitting area and the non-emissive area, and
the light absorption layer in the light emitting area includes the recessed portion.

20. The illumination device according to claim 19, wherein a lower face of the first electrode at a position inside the recessed portion is positioned lower than a plane including one face side of the base material.

* * * * *